(12) United States Patent
Sakurai et al.

(10) Patent No.: US 6,809,020 B2
(45) Date of Patent: Oct. 26, 2004

(54) METHOD FOR FORMING BUMP, SEMICONDUCTOR DEVICE AND METHOD FOR MAKING THE SAME, CIRCUIT BOARD, AND ELECTRONIC DEVICE

(75) Inventors: Kazunori Sakurai, Chino (JP); Tsutomu Ota, Chino (JP); Fumiaki Matsushima, Chino (JP); Akira Makabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 122 days.

(21) Appl. No.: 09/843,924

(22) Filed: Apr. 30, 2001

(65) Prior Publication Data
US 2001/0040290 A1 Nov. 15, 2001

(30) Foreign Application Priority Data

| May 1, 2000 | (JP) | 2000-132172 |
| Sep. 8, 2000 | (JP) | 2000-272595 |
| Feb. 21, 2001 | (JP) | 2001-044824 |

(51) Int. Cl.$^7$ ............................................. H01L 21/44
(52) U.S. Cl. .................. 438/613; 438/612; 438/614
(58) Field of Search ............................... 438/612, 613, 438/614, 694

(56) References Cited

U.S. PATENT DOCUMENTS

| 4,205,099 A | | 5/1980 | Jones et al. | |
| 4,950,623 A | * | 8/1990 | Dishon | 438/614 |
| 5,137,845 A | * | 8/1992 | Lochon et al. | 438/614 |
| 5,310,699 A | * | 5/1994 | Chikawa et al. | 438/614 |
| 5,830,533 A | * | 11/1998 | Lin et al. | 427/272 |
| 6,093,964 A | | 7/2000 | Saitoh | |
| 6,218,281 B1 | * | 4/2001 | Watanabe et al. | 438/612 |
| 6,221,692 B1 | * | 4/2001 | Shoji et al. | 438/106 |
| 6,297,142 B1 | * | 10/2001 | Mita et al. | 438/612 |
| 6,300,250 B1 | * | 10/2001 | Tsai | 438/694 |
| 6,372,547 B2 | * | 4/2002 | Nakamura et al. | 438/118 |
| 6,440,836 B1 | * | 8/2002 | Lu et al. | 438/612 |
| 2001/0014524 A1 | * | 8/2001 | Farrar | 438/613 |

FOREIGN PATENT DOCUMENTS

| EP | 0 766 310 A2 | 4/1997 |
| JP | A-3-101234 | 4/1991 |
| JP | A 6-140409 | 5/1994 |
| JP | A 9-97791 | 4/1997 |
| JP | 9-252003 | 9/1997 |
| JP | A 10-50708 | 2/1998 |

* cited by examiner

Primary Examiner—Richard Elms
Assistant Examiner—Beth E. Owens
(74) Attorney, Agent, or Firm—Oliff & Berridge, PLC

(57) ABSTRACT

The invention provides a method for readily forming a bump with a desired width, a semiconductor device and a method for making the same, a circuit board, and an electronic device. A method for forming a bump includes forming an opening in an insulating film which exposes at least a part of a pad, and forming the bump so as to be connected to the pad. A resist layer 20 defines a through hole which extends over at least a part of the pad in plan view. A metal layer is formed in the opening so as to connect to the exposed portion of the pad.

27 Claims, 22 Drawing Sheets

[FIG. 1]
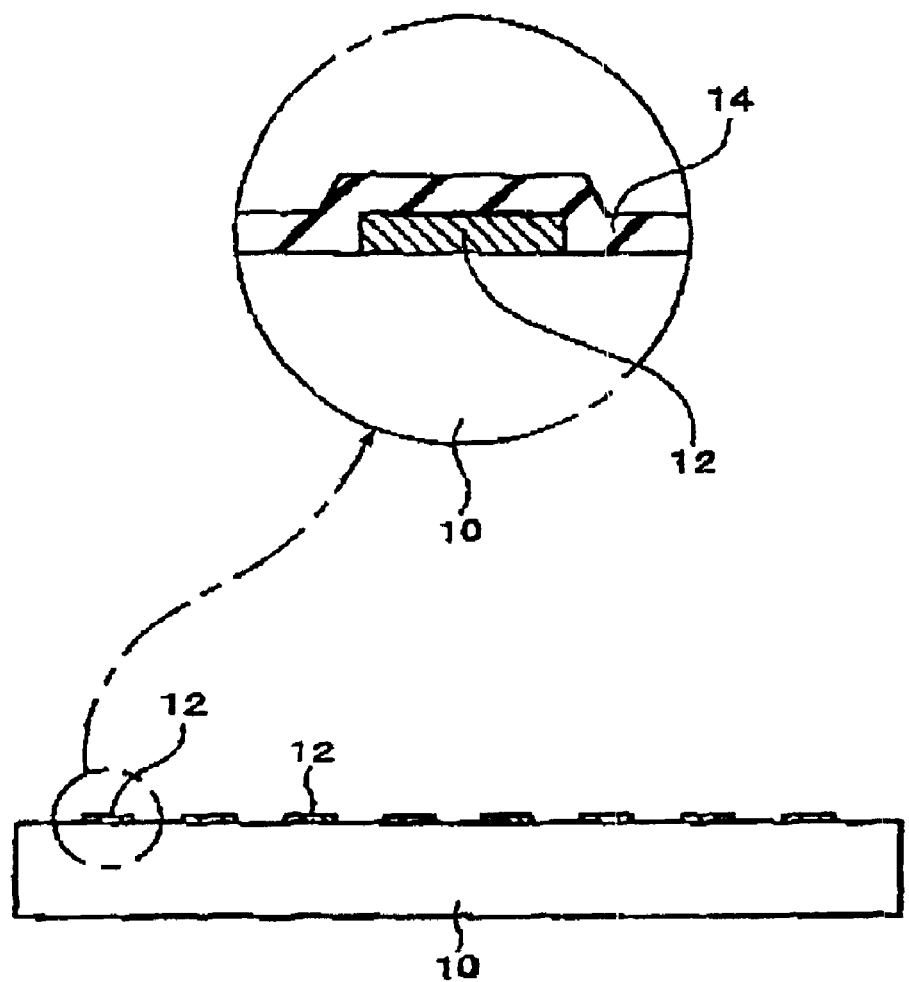

[FIG. 2]
(A)
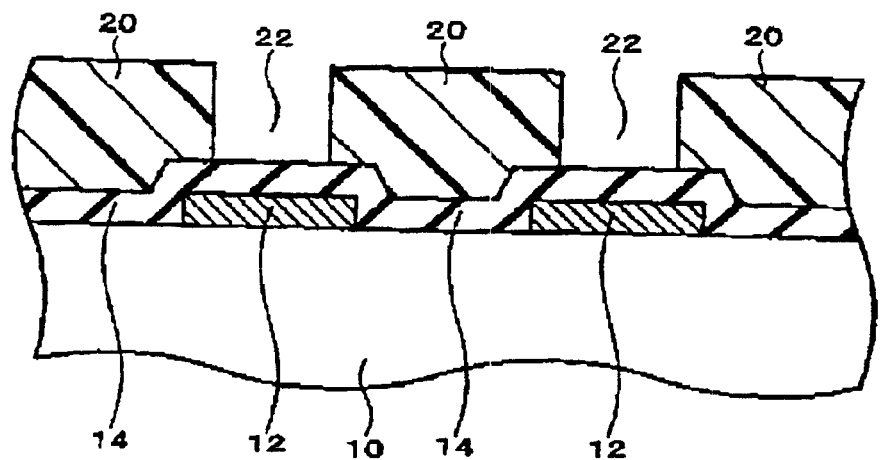
(B)
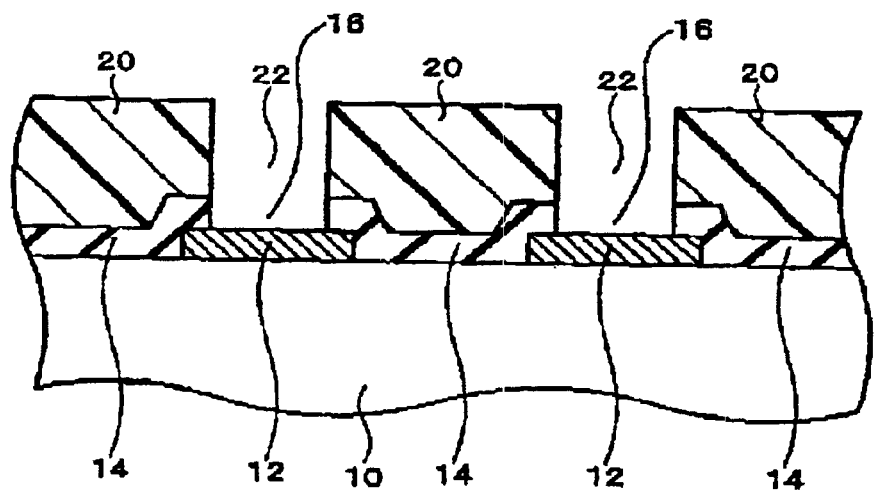

[FIG. 3]
(A)
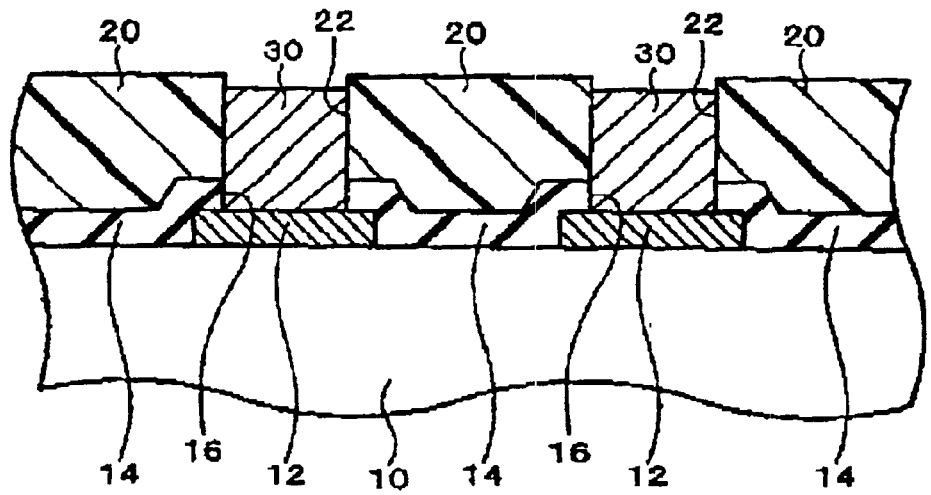
(B)
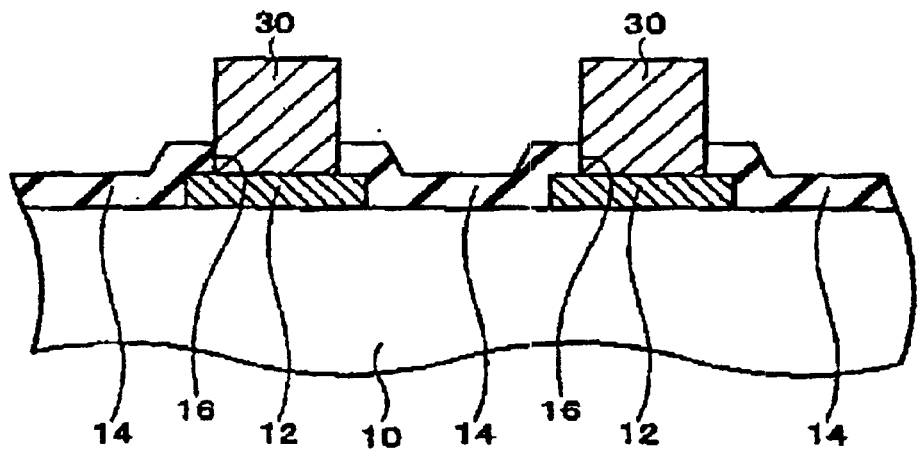
(C)
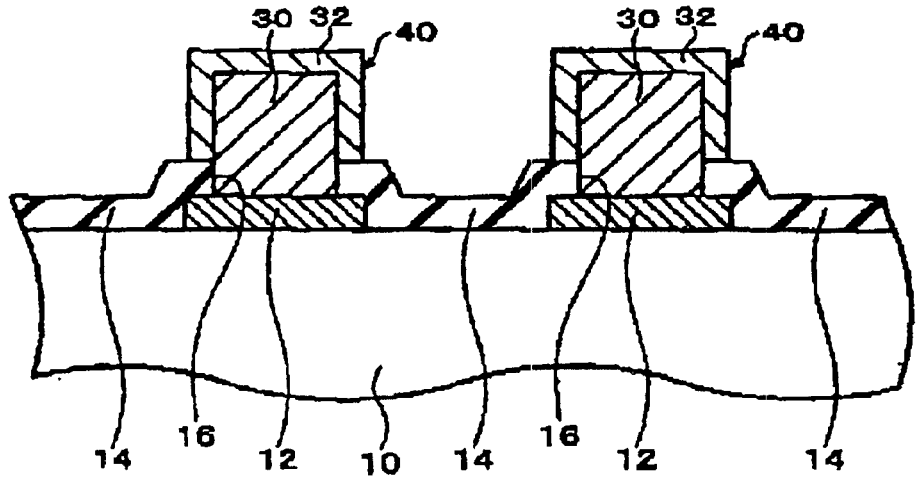

[FIG. 4]
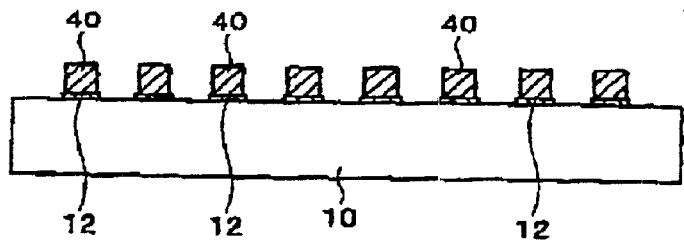
[FIG. 5]
(A)
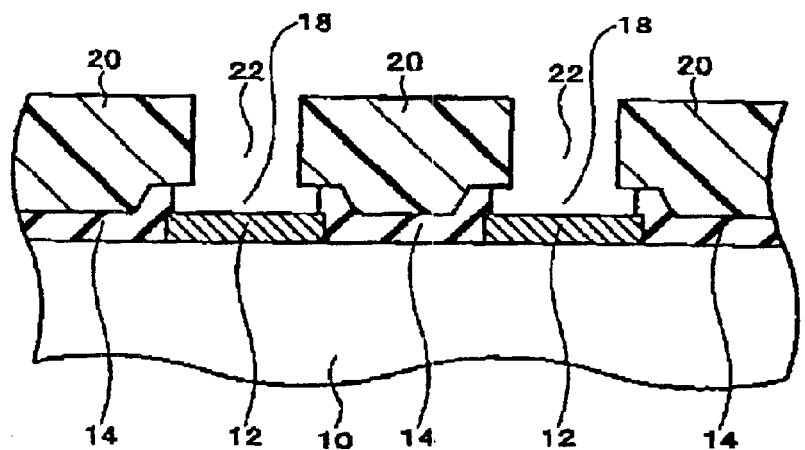
(B)
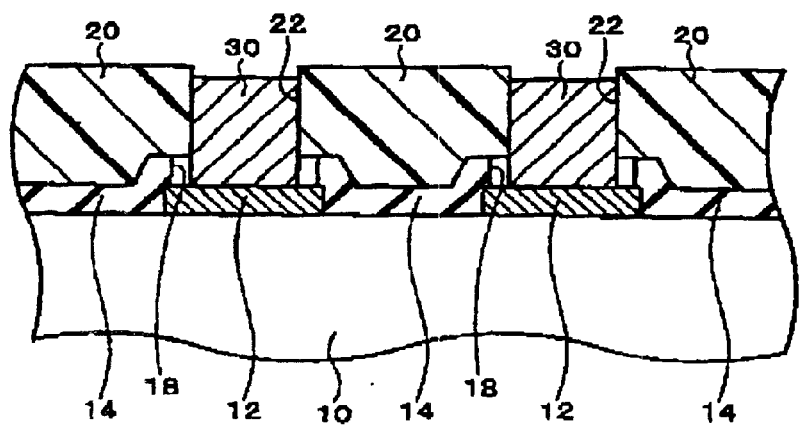

[FIG. 6]
(A)
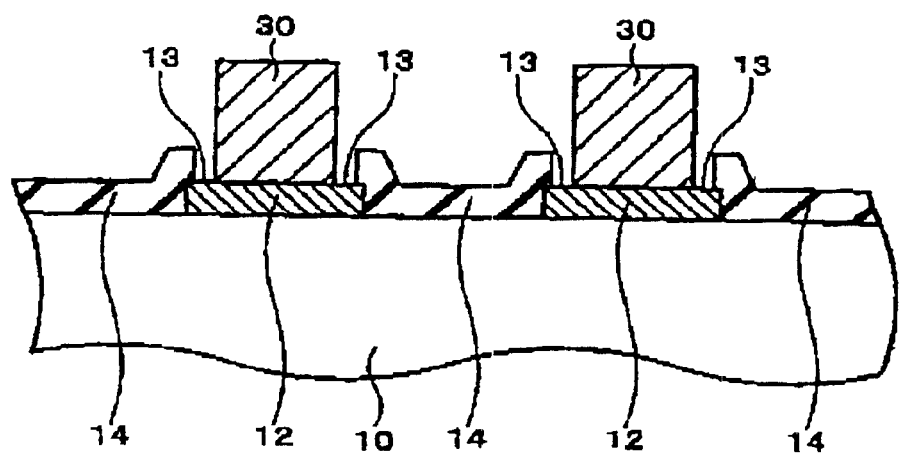
(B)
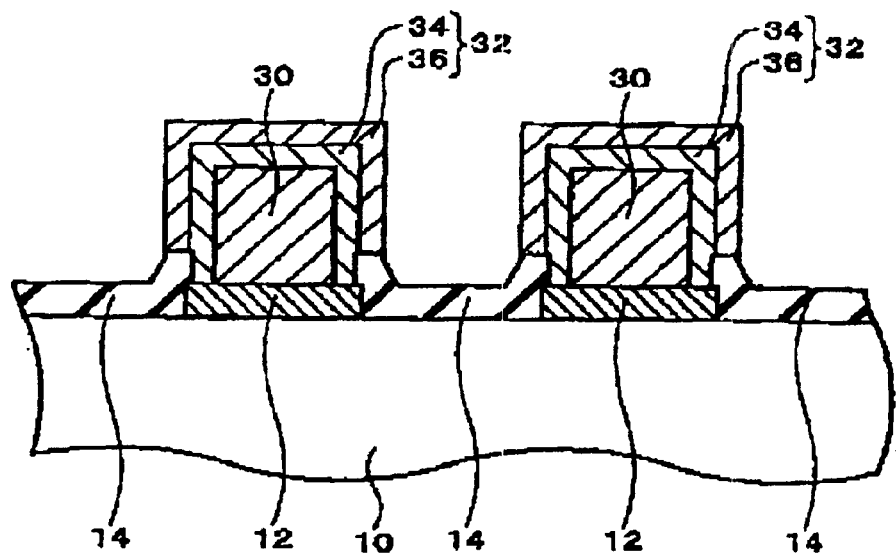

[FIG. 7]
(A)
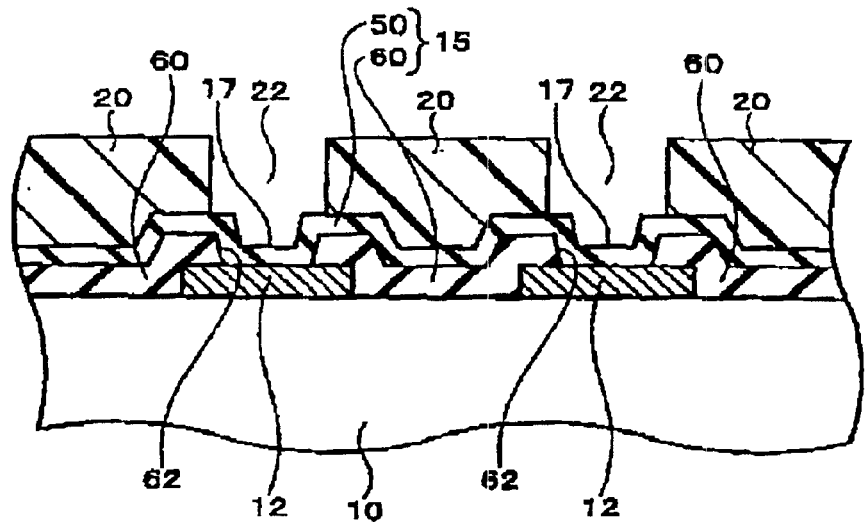
(B)
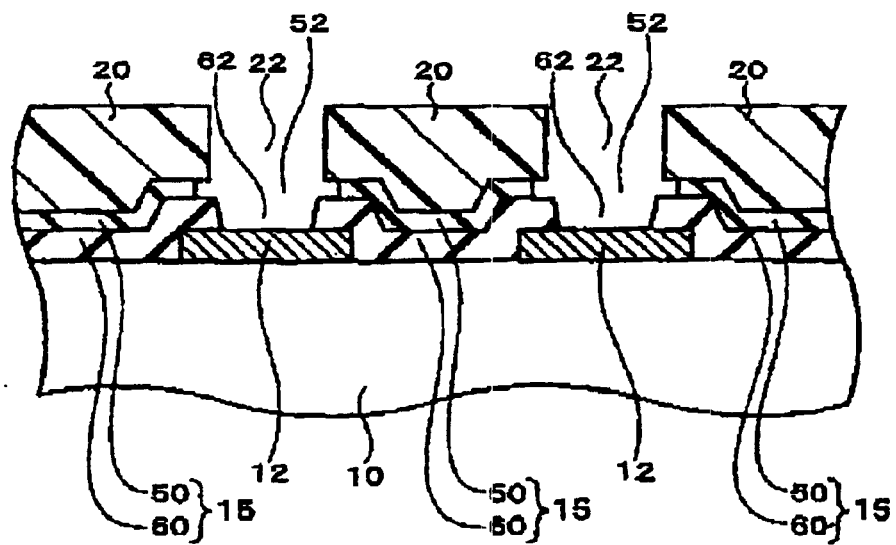

[FIG. 8]
(A)
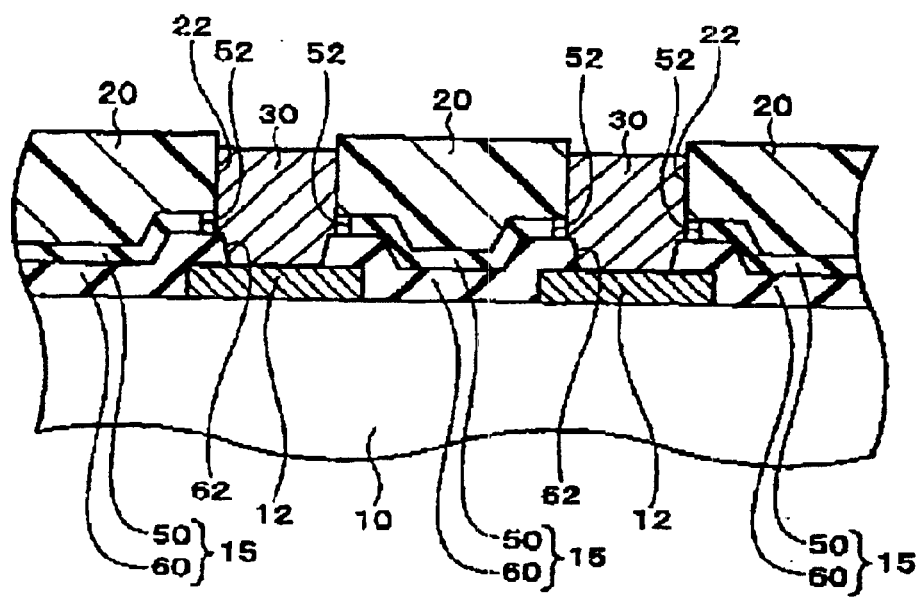
(B)
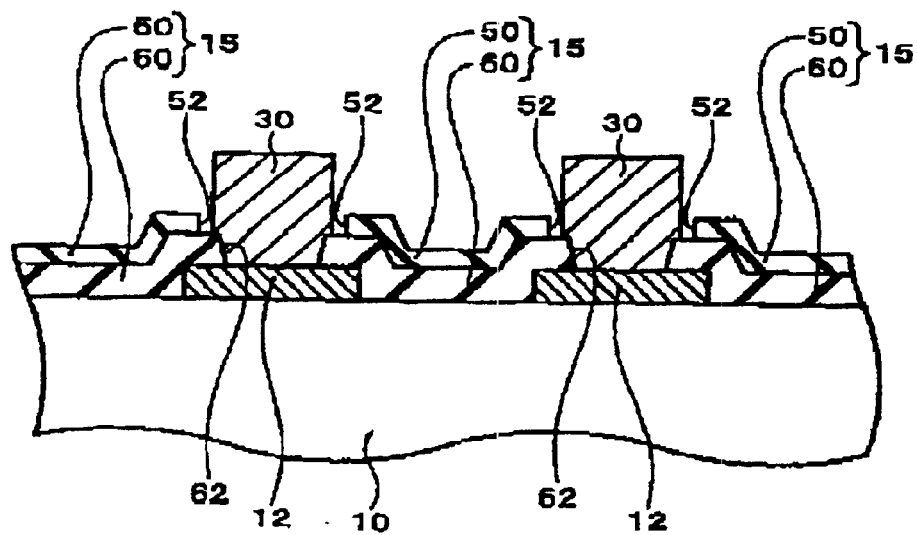

[FIG. 9]
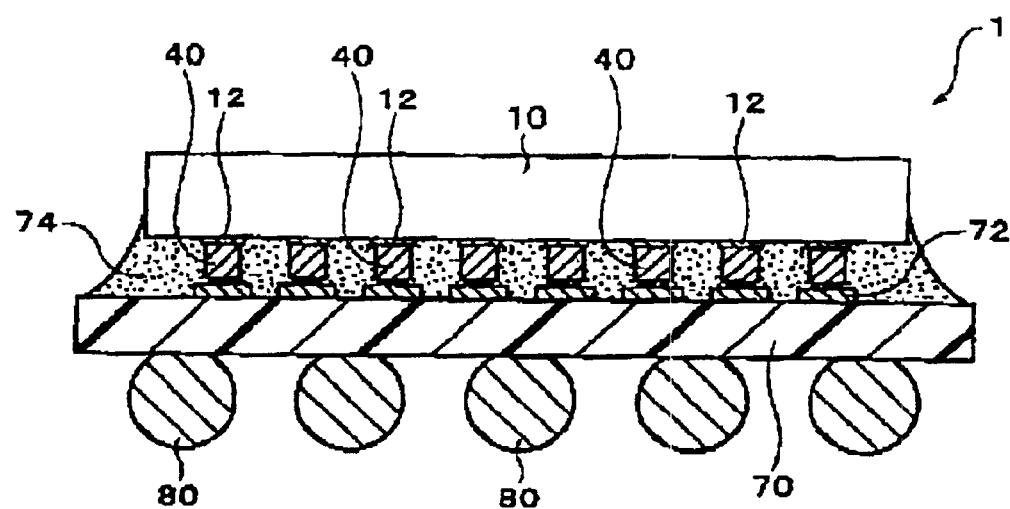

[FIG. 10]
(A)
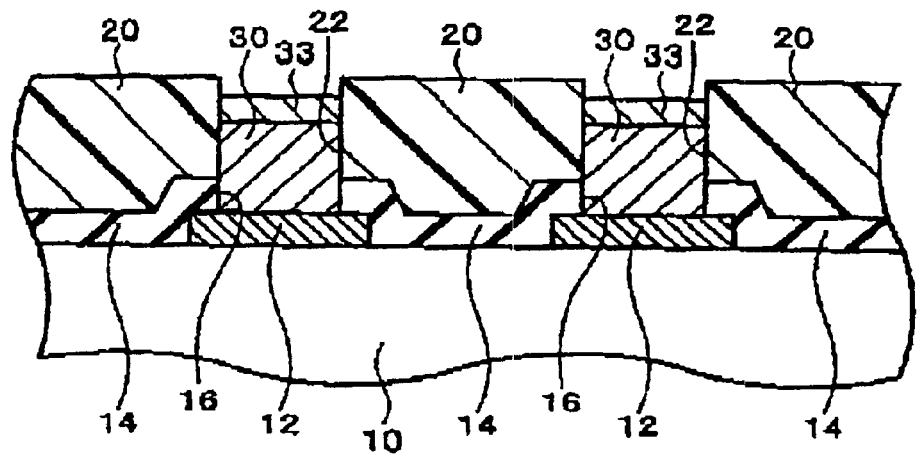
(B)
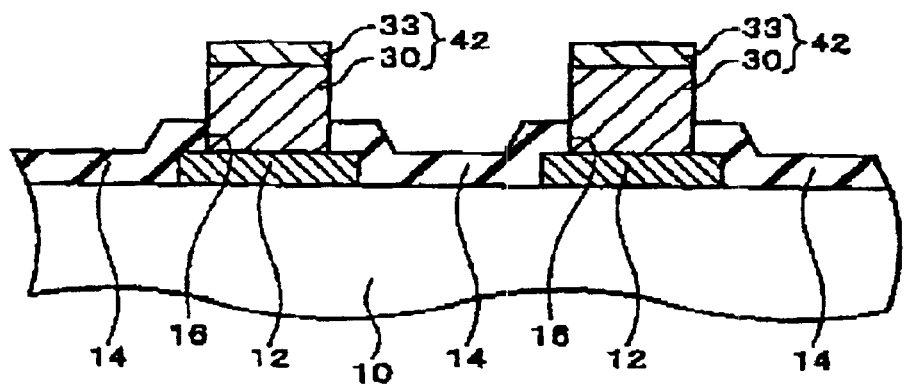
(C)
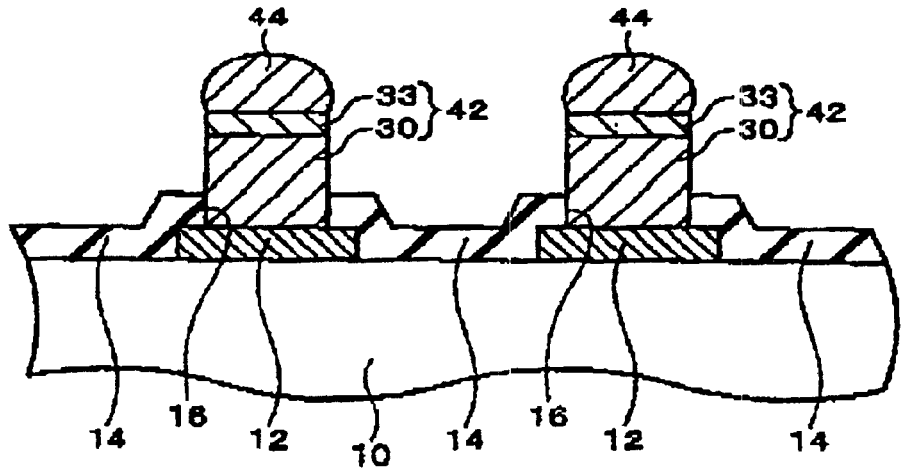

[FIG. 11]
(A)
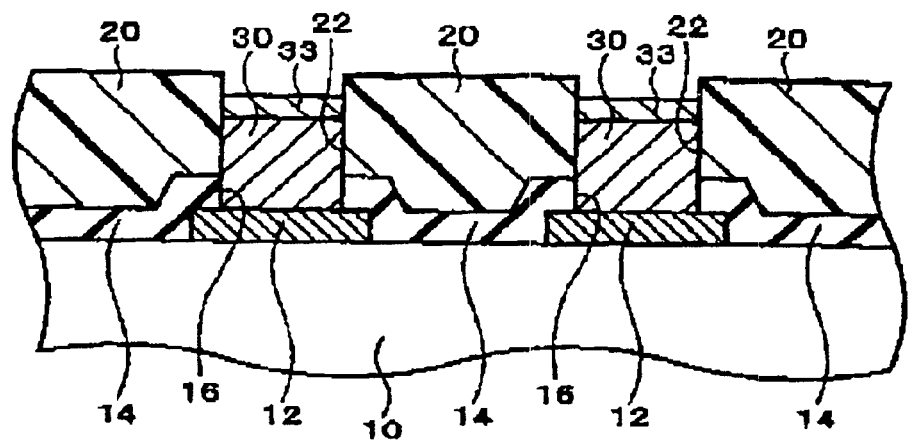
(B)
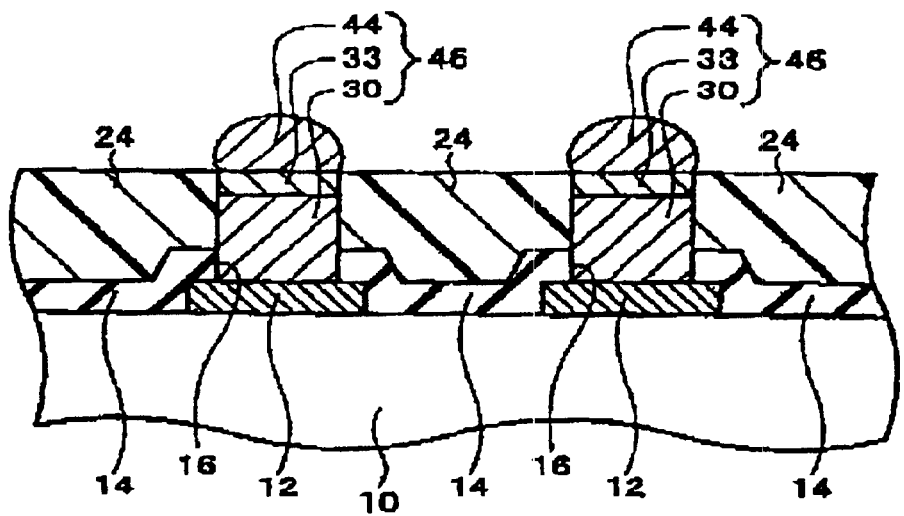

[FIG. 12]
(A)
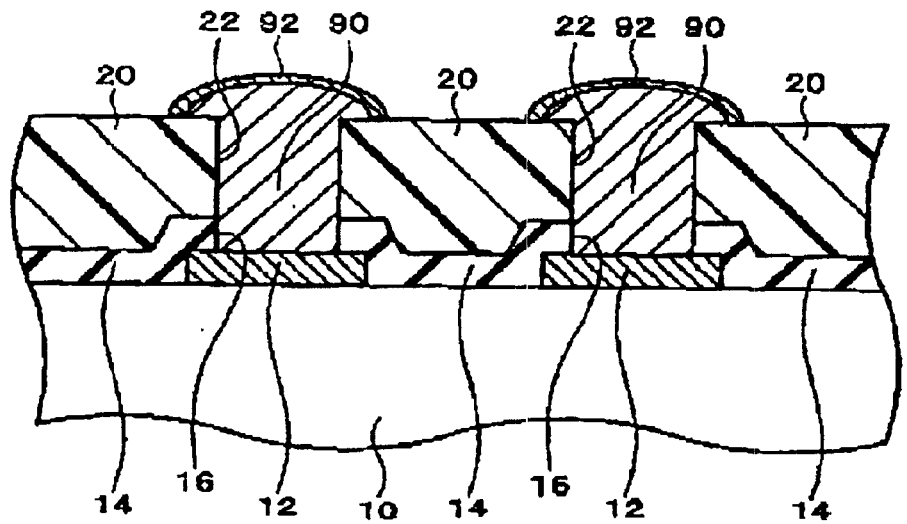
(B)
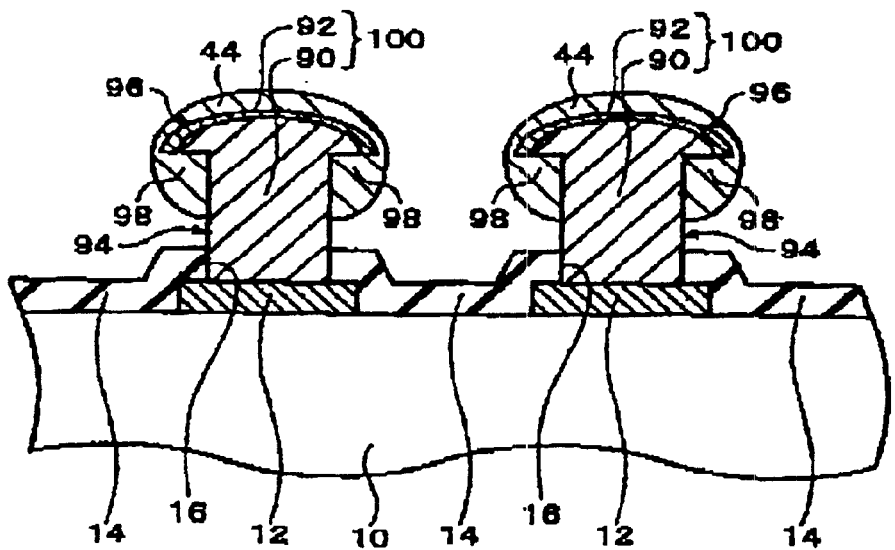

[FIG. 13]
(A)
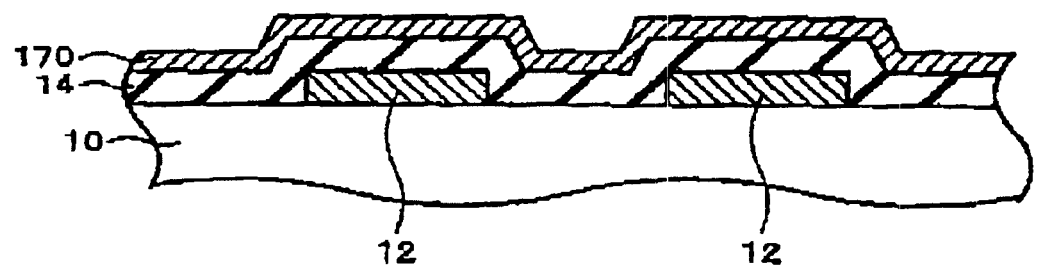
(B)
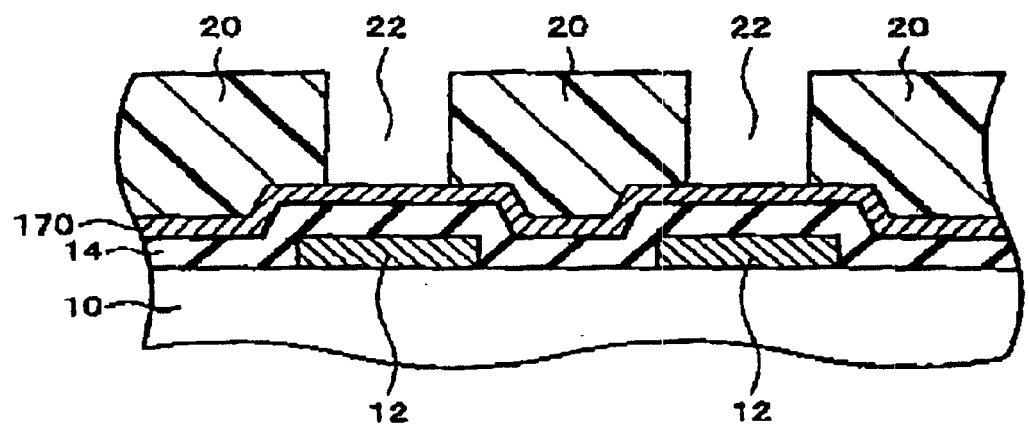
(C)
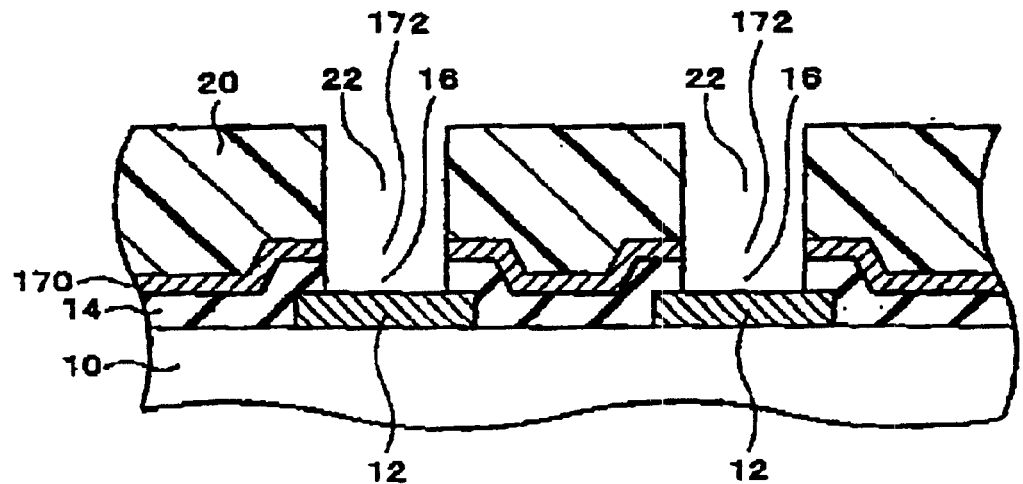

[FIG. 14]
(A)
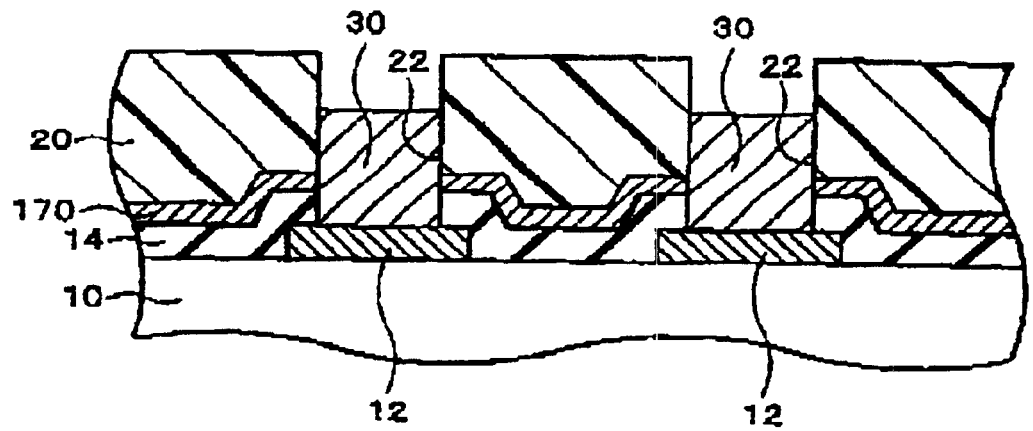
(B)
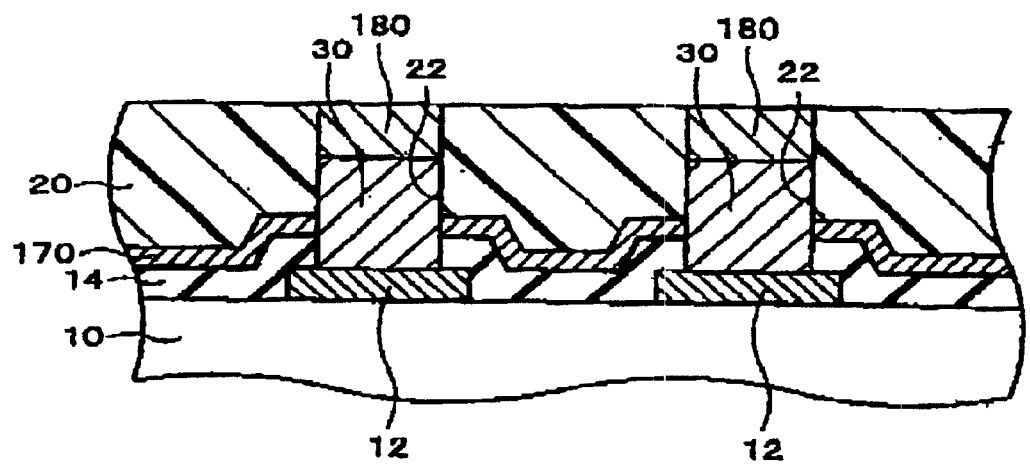
(C)
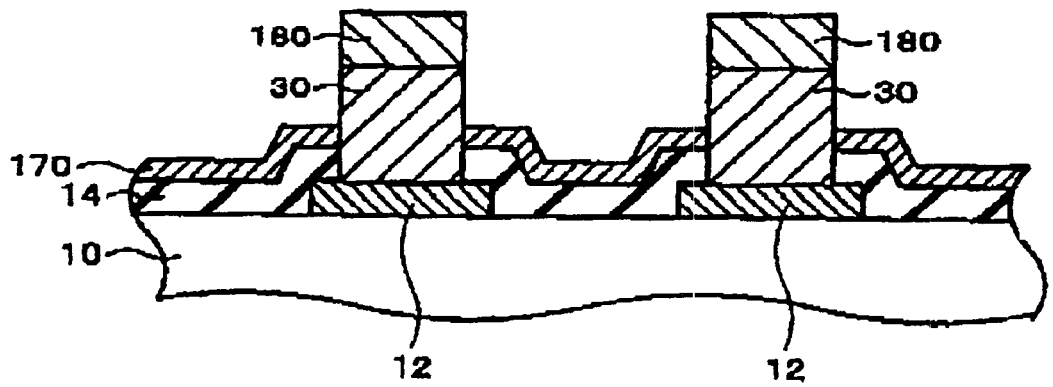

[FIG. 15]
(A)
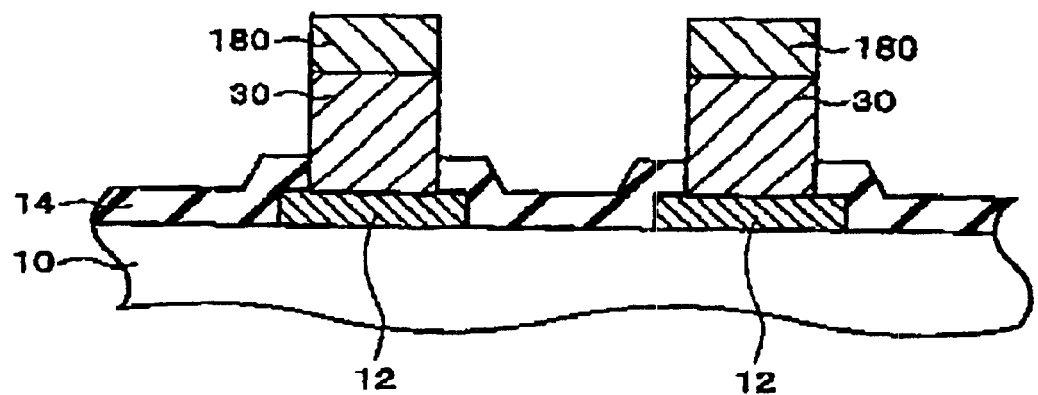
(B)
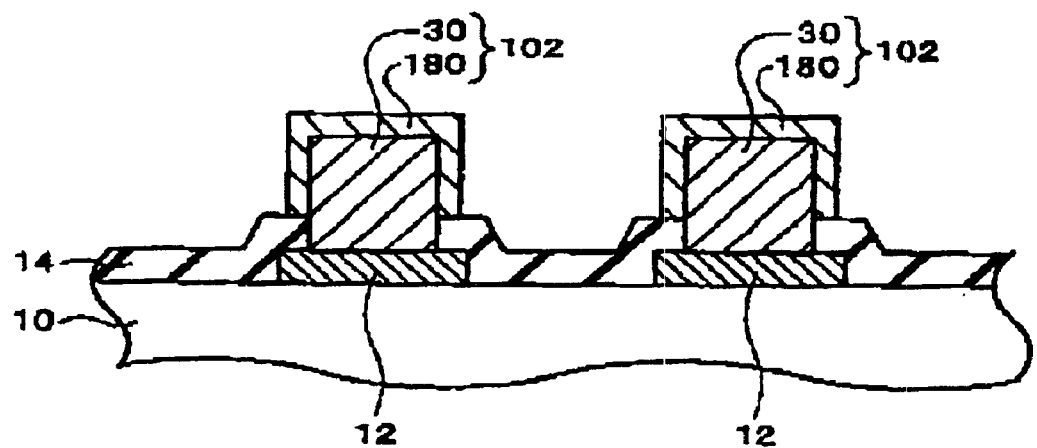

[FIG. 16]
(A)
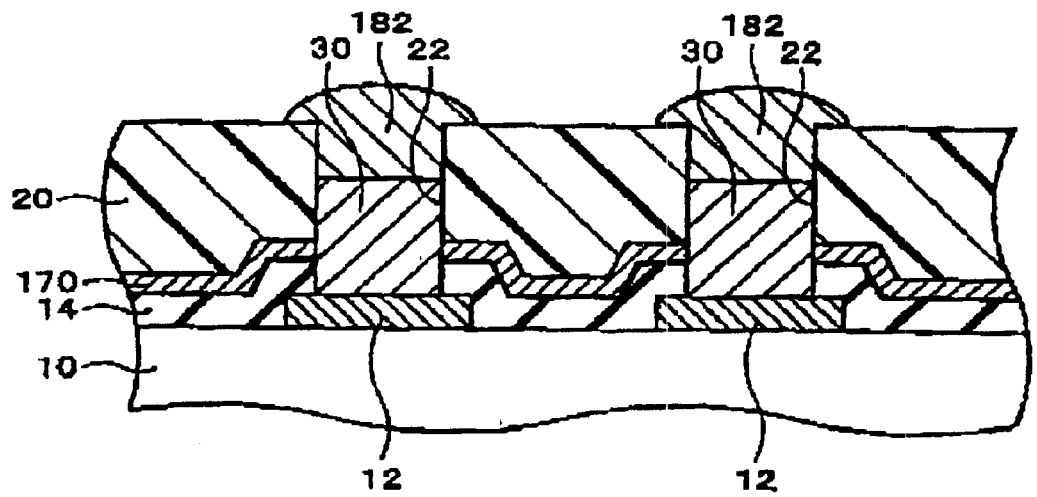
(B)
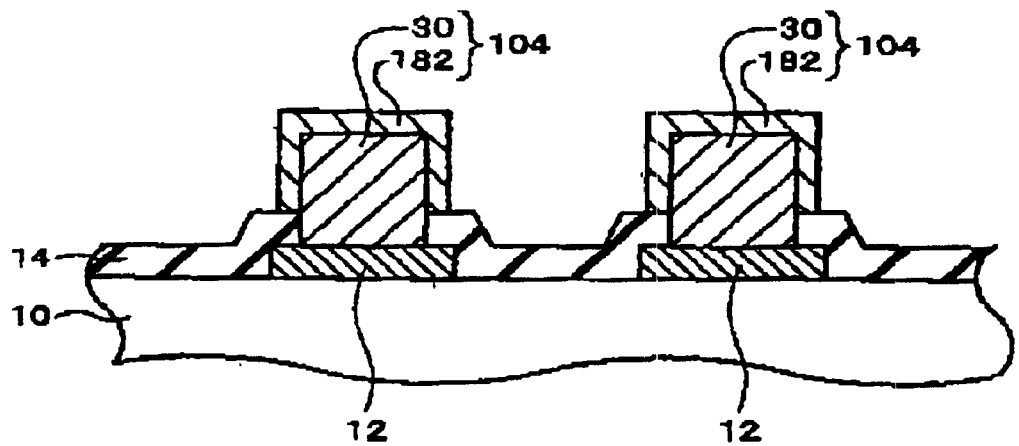

[FIG. 17]
(A)
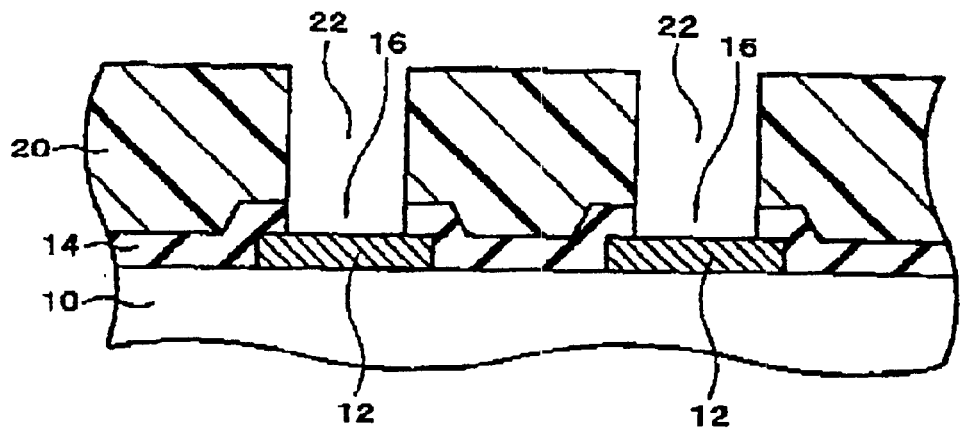
(B)
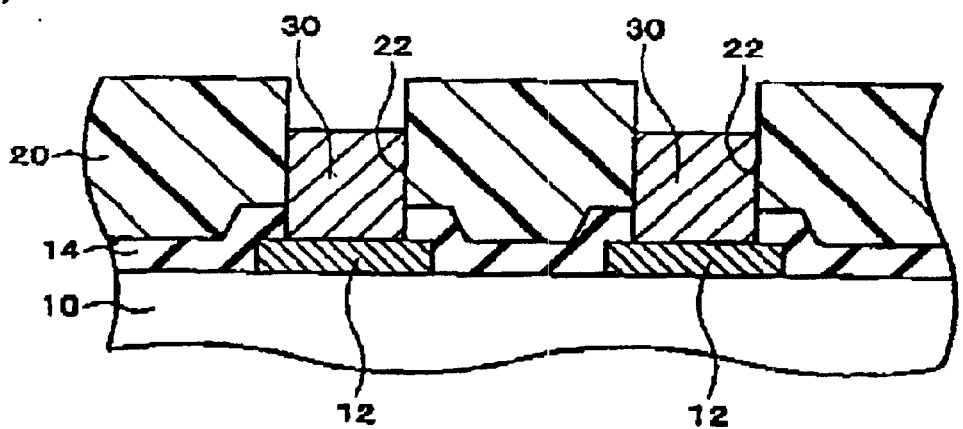
(C)
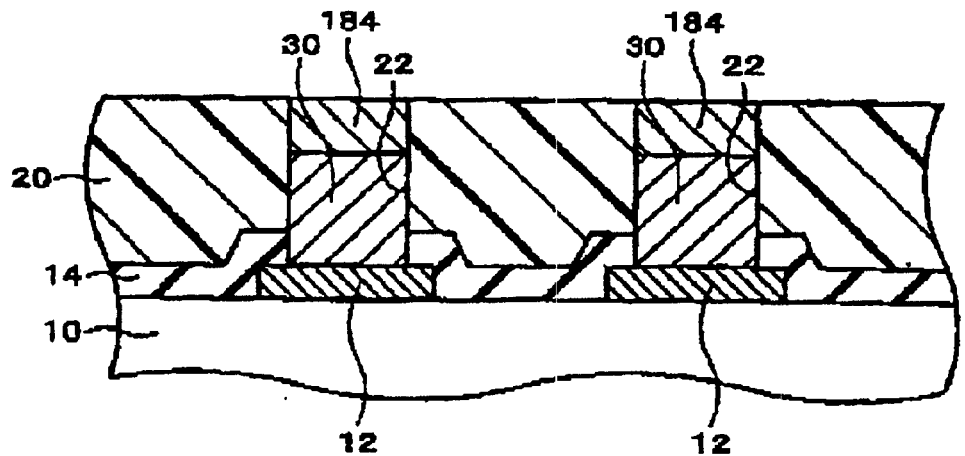

[FIG. 18]
(A)
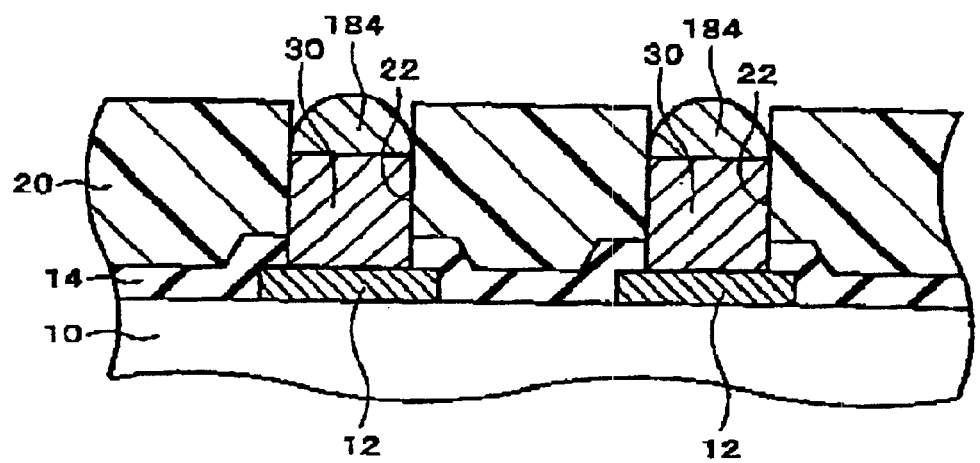
(B)
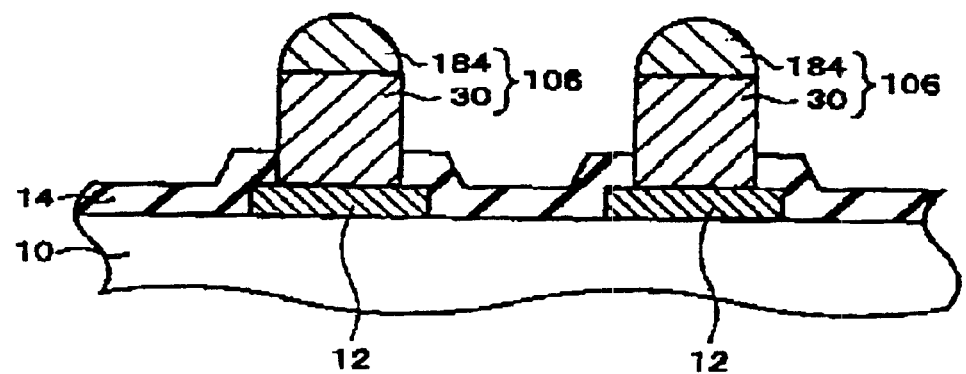

[FIG. 19]
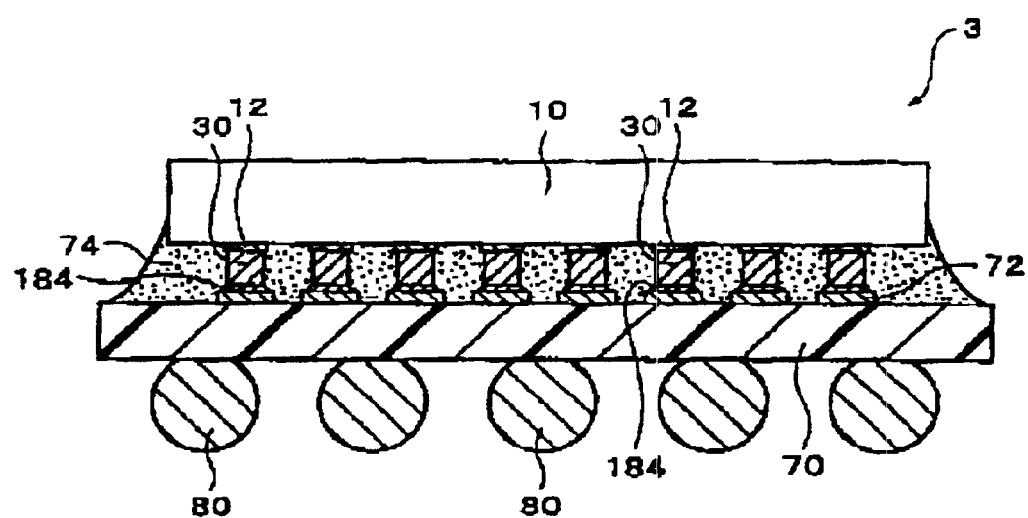

[FIG. 20]
(A)
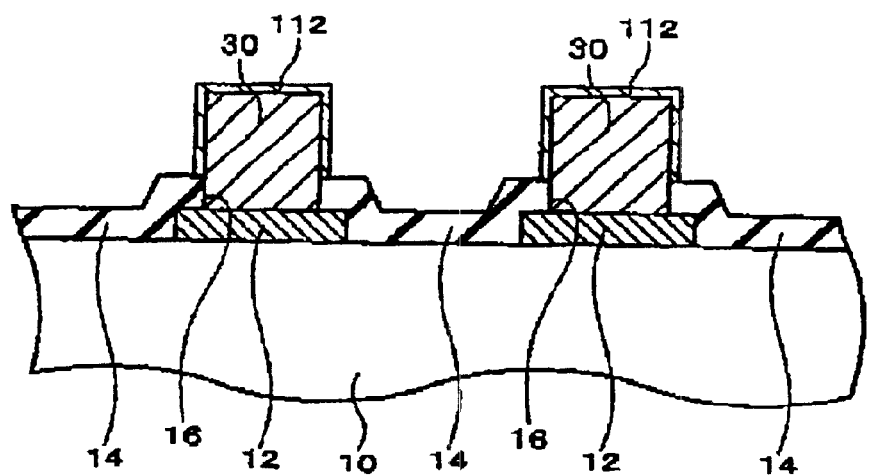
(B)
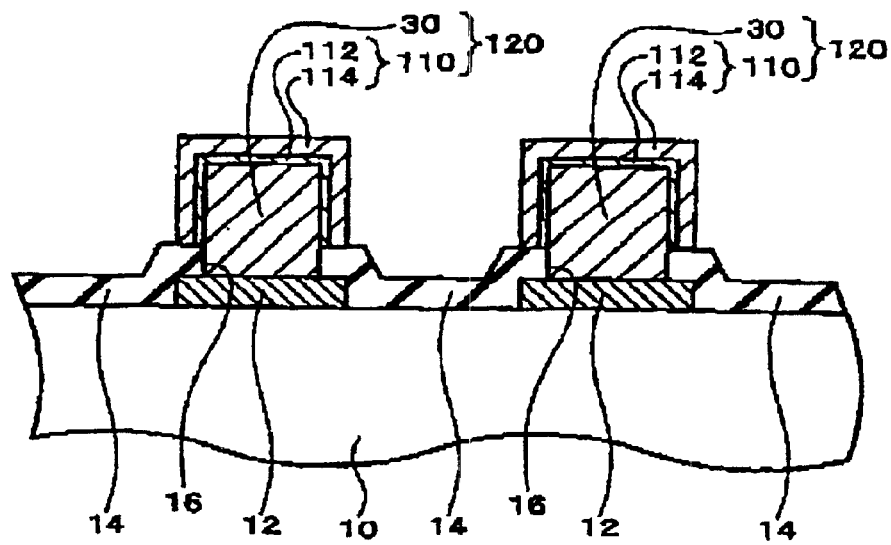

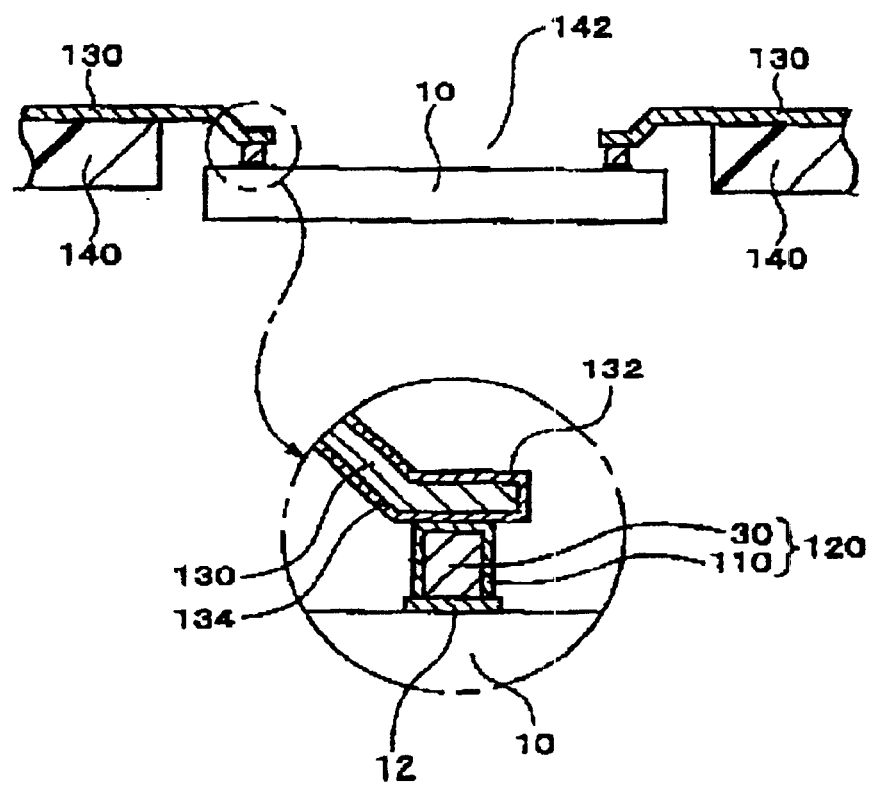

[FIG. 23]
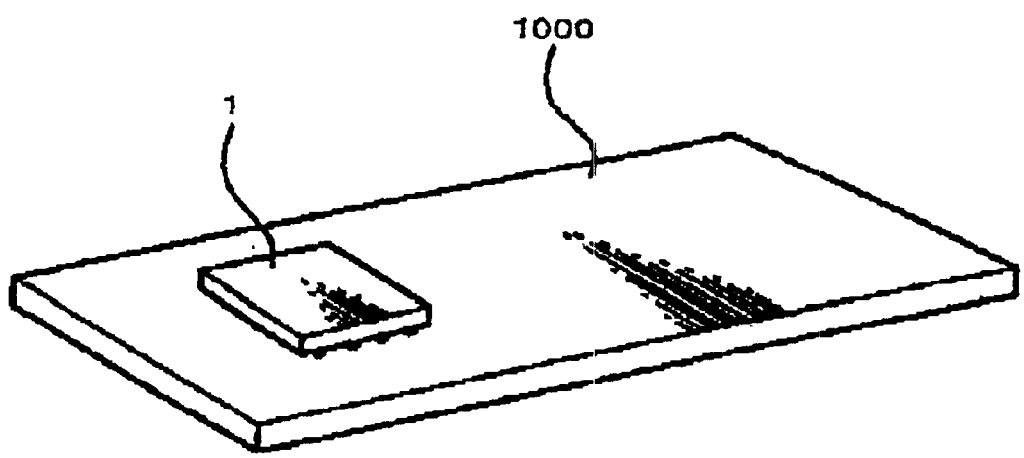
[FIG. 24]
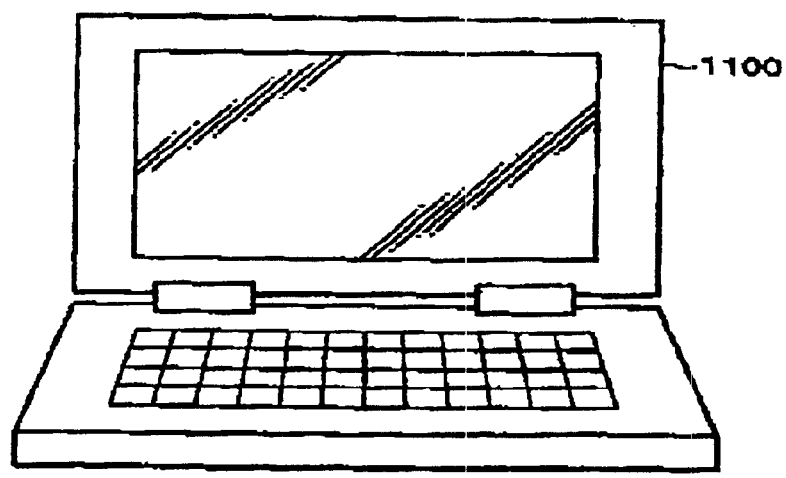

[FIG. 25]
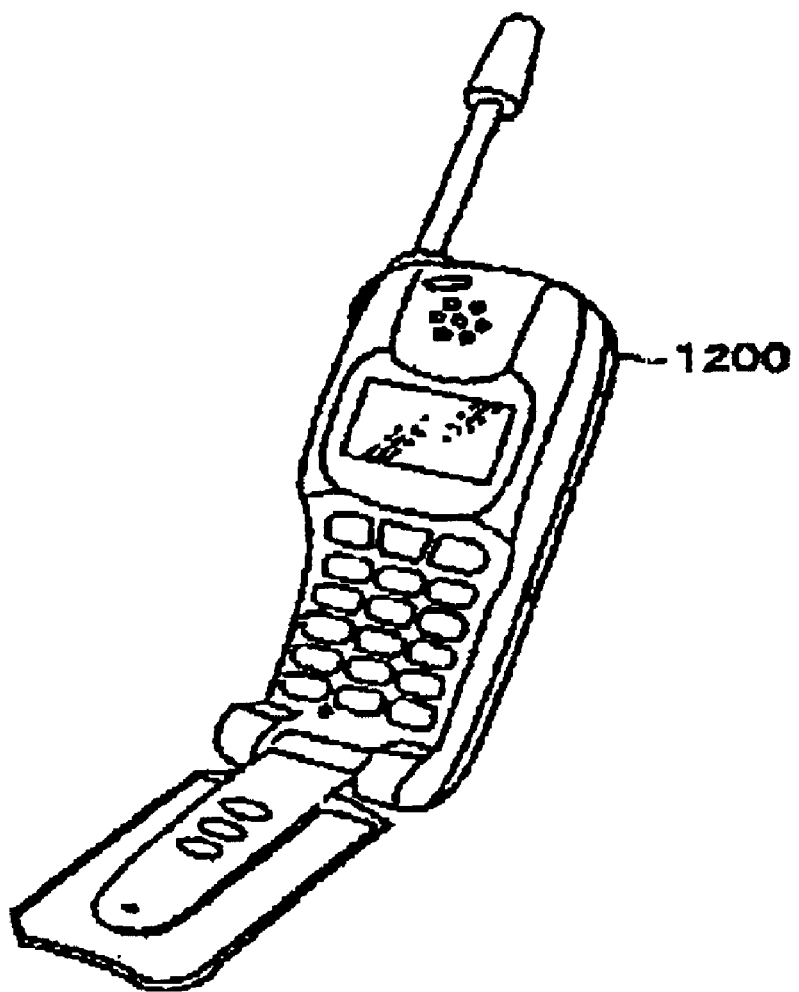

METHOD FOR FORMING BUMP, SEMICONDUCTOR DEVICE AND METHOD FOR MAKING THE SAME, CIRCUIT BOARD, AND ELECTRONIC DEVICE

BACKGROUND OF THE INVENTION

1. Field of Invention

The present invention relates to a method for forming a bump, a semiconductor device and a method for making the same, a circuit board, and an electronic device.

2. Description of Related Art

A method for forming a bump composed of a metal or the like on a pad of a semiconductor chip by electroless plating is known.

In electroless plating, the bump grows not only in the height direction but also in the width direction (isotropic growth). The width of the bumps may therefore exceed the width of the pads. Thus, it is difficult to form bumps onto pads with a narrow pitch.

SUMMARY OF THE INVENTION

It is an object of the present invention, for solving the above problem, to provide a method for readily forming a bump with a desired width, a semiconductor device and a method for making the same, a circuit board, and an electronic device.

(1) The method for forming a bump in accordance with the present invention includes:

forming an opening in an insulating film which exposes at least a part of a pad;

forming a bump connected to the pad;

forming a resist layer having a through hole which overlaps at least a portion of the pad; and forming a metal layer which is connected to the portion of the pad which is exposed at the opening.

According to the present invention, for example, the through hole in the resist layer communicates with the opening formed in the insulating film. The metal layer can thereby be formed connected to the pad. Thus, the bump can be formed by a simplified step. When the metal layer is formed in the through hole in the resist layer, the bump can be formed so as to have a size corresponding to the size of the through hole, in other words, a desired width.

(2) In this method for forming the bump, the through hole may be formed so as not to protrude from the periphery of the pad.

According to this configuration, the metal layer can be formed so as not to protrude from the periphery of the pad. Thus, a bump can be formed on each of a plurality of pads arranged at a narrow pitch.

(3) In the method for forming the bump, the insulating film may be thicker at the periphery than in the center of the pad.

The semiconductor chip can be, therefore, surely protected by the thick insulating film. The thick portion of the insulating film may be formed of a plurality of layers.

(4) In the method for forming the bump, the through hole may be formed inside the periphery of the pad and at about the center of the pad, in which the insulating film is thinner.

The bump can be thereby formed without exposing the pad.

(5) In the method for forming the bump, the metal layer may include a first metal layer and a second metal layer formed on the first metal layer.

(6) In the method for forming the bump, the opening may be formed so as to be larger than the periphery of the through hole so that a region for forming the first metal layer and an exposed portion of the pad are formed, and the second metal layer may be formed on the pad so as to cover the exposed portion.

Since the exposed portion of the pad is covered with the second metal layer even if the opening is larger than the through hole, the pad is not exposed.

(7) In the method for forming the bump, the first metal layer may be formed in the through hole, the resist layer may be removed, and then the second metal layer may be formed so as to cover the first metal layer.

Oxidation of the surface of the first metal layer is thereby prevented.

(8) In the method for forming the bump, the first metal layer may be formed in the through hole, and then the second metal layer may be formed on the first metal layer without removing the resist layer.

When a material having high affinity with a solder is selected as the second metal layer, the solder can be provided substantially only on the upper face of the metal layer. That is, the solder can be prevented from spreading from the periphery of the metal layer, and the solder can be provided without short-circuiting between adjacent pads.

(9) In the method for forming the bump, the first metal layer may be formed so as to protrude from the through hole so that the first metal layer has a tip having a width which is larger than the width of the through hole.

The tip of the first metal layer is larger than the width of the through hole. Thus, the bump has a space for holding a portion of the solder. Accordingly, the solder can be provided without spread from the periphery of the metal layer, that is, without short-circuiting between the pads.

(10) In the method for forming the bump, the second metal layer may be formed so as to protrude from the through hole so that the second metal layer has a tip having a width which is larger than the width of the through hole.

The tip of the second metal layer is formed so as to have a width which is larger than the width of the through hole. Thus, the bump has a space for holding a portion of the solder. Accordingly, the solder can be prevented from spreading from the periphery of the metal layer, that is, without short-circuiting between adjacent pads.

(11) In the method for forming the bump, the first metal layer may be formed by electroless plating.

(12) In the method for forming the bump, the second metal layer may be formed by electroless plating.

(13) The method for forming the bump may further include the step of providing a solder on the metal layer.

(14) In the method for forming the bump, in the step of providing the solder, a resin layer may be provided at the periphery of the metal layer other than at least the upper face so that the solder is provided at a portion, exposed from the resin layer, of the metal layer.

Since the resin layer repels the solder, an optimum amount of solder is provided on the metal layer. When the solder is melted, spreading thereof from the periphery of the metal layer can be prevented. Thus, in a plurality of pads of a semiconductor chip, contact of the solder with an adjacent pad is prevented.

(15) In the method for forming the bump, the metal layer may be formed so as to be substantially flush with the resist layer, and the solder may be provided at a portion, exposed from the resist layer, of the metal layer.

Since the same resist is used for forming the metal layer and the solder, the step is simplified.

(16) In the method for forming the bump, the first metal layer may be formed so as to be lower than the resist layer, and the second metal layer may be provided by a printing process through the resist layer as a mask.

Since the printed mask is the resist layer, the second metal layer can be provided regardless of releasability of the mask. Since no additional printed mask is formed, the second metal layer can be formed via reduced production steps.

(17) In the method for forming the bump, a conductive film electrically connected to the first metal layer at the periphery of the through hole may be formed on the insulating material, the first metal layer may be formed so as to be lower than the resist layer, and the second metal layer may be provided by electroplating using the conductive film as an electrode.

According to this method, a variation in the composition of the second metal layer can be suppressed compared to the formation by electroless plating. A variation in the melting point of the second metal layer is thereby prevented.

(18) In the method for forming the bump, the first metal layer may include a nickel-containing material.

(19) In the method for forming the bump, the second metal layer may include a gold-containing material.

(20) In the method for forming the bump, the second metal layer may include a solder.

(21) In the method for forming the bump, the solder may include Sn, or Sn and at least one metal selected from Ag, Cu, Bi, and Zn.

(22) In the method for forming the bump, the second metal layer may include first and second Au layers, the first Au layer being formed on the first metal layer by immersion plating and the second Au layer being formed on the first Au layer by autocatalytic plating.

The Au layer having a large thickness can be thereby formed on the surface of the bump. When the Au layer is formed on the surface of the first metal layer, the Au layer can be directly connected to a lead, as in the case in which the entire bump is formed of Au.

(23) In the method for forming the bump, the second metal layer may include an Au layer and a Sn layer, the Au layer being formed on the first metal layer by immersion plating and the Sn layer being formed on the Au layer by autocatalytic plating.

(24) In the method for forming the bump, in the step of forming the Sn layer, the electroless tin plating solution may contain at least one of Cu and Ag so as to deposit Sn and at least one of Cu and Ag.

According to this configuration, the bump can be satisfactorily connected to a lead even if the lead includes a material other than gold.

(25) In a method for making a semiconductor device in accordance with the present invention, the metal layer is formed on the pad formed in a semiconductor chip by the above method for forming the bump.

(26) The method for making the semiconductor device further may include the step of electrically connecting the bump to a lead, the second metal layer in the bump and the lead thereby forming an eutectic crystal.

(27) A semiconductor device in accordance with the present invention is produced by the above method for making the semiconductor device.

(28) A semiconductor device in accordance with the present invention includes:

a semiconductor chip having a plurality of pads;

an insulating film formed on the semiconductor chip so that the insulating film covers at least an end of each of the pads such that the pads have regions which are not covered with the insulating film; and a bump formed on each pad, the bump including a first metal layer formed in the region which is not covered with the insulating film so as not to contact the insulating film, and a second metal layer formed so as to cover the first metal layer and contact the insulating layer.

(29) A semiconductor device in accordance with the present invention includes:

a semiconductor chip having a plurality of pads;

an insulating film formed on the semiconductor chip so that the insulating film covers at least an end of each of the pads such that the pads have regions which are not covered with the insulating film; and a bump formed on each pad, the bump being formed so that the end thereof lies on the insulating film and the bump covers the region, and the thickness of a portion of the insulating film that is not above the pad is larger than another portion of the insulating film that is disposed below the bump.

According to the present invention, the surface of the semiconductor chip is covered with a thick layer and the insulating layer is thin below the end of the bump. Since the surface of the semiconductor chip is covered with the thick layer, the moisture resistance of the semiconductor chip can be enhanced. Since the step difference by the insulating film below the end of the bump is reduced, reliability of the connection between the pad and bump is enhanced.

(30) A semiconductor device according to the present invention includes:

a semiconductor chip having a plurality of pads; and a bump including a pillar shaped body connected to each of the pads and a tip connected to the body, the tip having a width which is larger than the width of the body, the bump having a space for holding a solder between a portion exceeding the width of the body at the tip and the body.

According to the present invention, the bump has a space for holding a portion of the solder. When the solder is melted on the bump, the solder does not spread toward the exterior of the metal layer, thereby preventing mutual short-circuiting between adjacent pads.

(31) A circuit board in accordance with the present invention mounts the above semiconductor device.

(32) An electronic device in accordance with the present invention includes the above-mentioned semiconductor device.

BRIEF DESCRIPTION OF THE DRAWINGS

FIG. 1 shows a method for forming a bump according to a first embodiment of the present invention.

FIG. 2(A) and FIG. 2(B) show a method for forming a bump according to the first embodiment of the present invention.

FIG. 3(A) to FIG. 3(C) show a method for forming a bump according to the first embodiment of the present invention.

FIG. 4 shows a method for forming a bump according to the first embodiment of the present invention.

FIG. 5(A) and FIG. 5(B) show a method for forming a bump according to a second embodiment of the present invention.

FIG. 6(A) and FIG. 6(B) show a method for forming a bump according to the second embodiment of the present invention.

FIG. 7(A) and FIG. 7(B) show a method for forming a bump according to a third embodiment of the present invention.

FIG. 8(A) and FIG. 8(B) show a method for forming a bump according to the third embodiment of the present invention.

FIG. 9 shows a method for forming a bump according to a fourth embodiment of the present invention.

FIG. 10(A) to FIG. 10(C) show a method for forming a bump according to a fifth embodiment of the present invention.

FIG. 11(A) and FIG. 11(B) show a method for forming a bump according to a sixth embodiment of the present invention.

FIG. 12(A) and FIG. 12(B) show a method for forming a bump according to a seventh embodiment of the present invention.

FIG. 13(A) to FIG. 13(C) show a method for forming a bump according to an eighth embodiment of the resent invention.

FIG. 14(A) and 14(C) show a method for forming a bump according to the eighth embodiment of the present invention.

FIG. 15(A) and FIG. 15(B) show a method for forming a bump according to the eighth embodiment of the present invention.

FIG. 16(A) and FIG. 16(B) show a method for forming a bump according to the eighth embodiment of the present invention.

FIG. 17(A) to FIG. 17(C) show a method for forming a bump according to a ninth embodiment of the present invention.

FIG. 18(A) and FIG. 18(B) show a method for forming a bump according to the ninth embodiment of the present invention.

FIG. 19 shows a method for forming a bump according to a tenth embodiment of the present invention.

FIG. 20(A) and FIG. 20(B) show a method for forming a bump according to an eleventh embodiment of the present invention.

FIG. 21 shows a method for forming a bump according to the eleventh embodiment of the present invention.

FIG. 22 shows a method for forming a bump according to the eleventh embodiment of the present invention.

FIG. 23 shows a circuit board which mounts a semiconductor device in accordance with an embodiment of the present invention.

FIG. 24 shows an electronic device having a semiconductor device in accordance with an embodiment of the present invention.

FIG. 25 shows an electronic device having a semiconductor device in accordance with an embodiment of the present invention.

DETAILED DESCRIPTION OF PREFERRED EMBODIMENTS

The preferred embodiments of the present invention will now be described with reference to the drawings. The present invention, however, is not limited to the following embodiments.

First Embodiment

FIGS. 1 to 4 illustrate a method for forming a bump in accordance with a first embodiment of the present invention. In this embodiment, an example for forming a bump onto a sensing current is described. However, the method for forming a bump in accordance with the present invention is not limited to this and may be applied to the formation of a bump onto a wiring pattern. In this case, a land in the wiring pattern corresponds to a pad. Also, the present invention may be applied to the formation of a bump onto a pad formed on a semiconductor wafer. Accordingly, the contents described below are not limited to semiconductor chip treatment and can also be applied to semiconductor wafer treatment.

In this embodiment, as shown in FIG. 1, a semiconductor chip 10 is prepared. The semiconductor chip 10 has a plurality of pads 12. The pads 12 function as electrodes of an integrated circuit formed inside the semiconductor chip 10. The pads 12 may be arranged at an end of the semiconductor chip 10 or in the center of the semiconductor chip 10. Also, the pads 12 may be arranged along two parallel ends or four ends when the semiconductor chip 10 is rectangular. The pads 12 may be formed in a region in which an integrated circuit is formed in the semiconductor chip 10. The pads 12 may be arranged as a matrix including a plurality of lines and rows. Each pad 12 is often formed so as to be thin and flat on the semiconductor chip 10. The side shape or the cross-sectional shape thereof are not limited, and the pad 12 may be flush with the face of the semiconductor chip 10. Also, the planar shape of the pads 12 is not limited and may be circular or rectangular. The pads 12 are formed of aluminum (Al), copper (Cu) or the like. The pitch between individual pads 12 can be determined without restriction depending on the design. The present invention is particularly effective, for example, in a semiconductor chip 10 having pads 12 having a narrow pitch of approximately 40 $\mu$m or less.

An insulating film 14 is formed on a face provided with the pads 12 of the semiconductor chip 10. The insulating film 14 is formed so as to cover each pad 12. In this embodiment, the insulating film 14 is formed of a single layer, but maybe formed of a plurality of layers, as shown in an example described below. The thickness of the insulating film 14 can be determined depending on the requirement without restriction. The insulating film 14 may be a general passivation film. The insulating film 14 can be formed of, for example, $SiO_2$, SiN, or a polyimide resin. In this embodiment, a step for exposing at least a part of each pad 12 from the insulating film 14 and a step for forming a bump on the pad 12 can be performed using the same resist layer 20. In detail, these steps can be performed using the same resist layer 20 formed for the first step, without forming resist layers 20 repeatedly.

As shown in FIG. 2(A), the resist layer 20 is formed. The resist layer 20 is formed on the face provided with the pads 12 of the semiconductor chip 10, that is, on the insulating film 14. The resist layer 20 has through holes 22 above the pads 12. The through holes 22 may be formed by a photolithographic process. That is, a photosensitive resist layer 20 is irradiated with energy and is developed to form the through holes 22. In this case, the resist layer 20 may be of a positive type or a negative type. The resist layer 20 may have a thickness of approximately 20 $\mu$m.

The through holes 22 may be formed by etching a non-photosensitive resist layer 20. Alternatively, the resist layer 20 may be formed by a screen printing process or an ink jet process.

The through holes 22 are preferably formed so as to have a size which does not protrude from the peripheries of the pads 12. A bump can thereby be formed on each of the plurality of pads 12 provided at a narrow pitch. The through holes 22 are preferably formed so as to have walls perpendicular to the face of the semiconductor chip 10. Bumps which vertically extend can thereby be formed. The planar shape of the through holes 22 is not limited and may be, for example, circular or rectangular.

As shown in FIG. 2(B), the portions of the insulating films 14 in the through holes 22 are removed through the resist layer 20 as a mask to form openings 16 so that at least parts of pads 12 are exposed. The openings 16 can be formed by etching. The etching process may be any one of a chemical process, a physical process, and a combination thereof. The etching characteristic may be isotropic or anisotropic. As described below, isotropic etching which etches equally in all directions can be applied to the present invention.

As shown in FIG. 2(B), in this embodiment, the openings 16 is formed within the range of the size of the through holes 22 in plan view. Such openings 16 can be formed by, for example, anisotropic etching. A first metal layer 30 is formed in each through hole 22 so that the surface of the pad 12 is not exposed. Furthermore, the opening 16 of the insulating film 14 can be easily formed using the through hole 22 formed in the resist layer 20.

As shown in FIG. 3(A), the first metal layers 30 are formed in the through hole 22. Since the through hole 22 communicates with the opening 16, the first metal layer 30 is formed in the through hole 22 so as to be electrically connected to the pad 12. The first metal layer 30 may be formed only inside the through hole 22 so as not to protrude from the height of the through hole 22. Alternatively, the first metal layer 30 may be flush with the resist layer 20, or may exceed the height of the through hole 22. The first metal layers 30 may be formed of nickel (Ni), copper (Cu), gold (Au), or the like. The first metal layer 30 may be a single layer as shown in FIG. 3(A), or may be formed of a plurality of layers.

The first metal layer 30 may be formed by electroless plating (including immersion plating). For example, for aluminum pads 12, the pads 12 are subjected to a zincate treatment so as to deposit zinc (Zn) on the surface of aluminum by substitution. In this case, it is preferable that the resist layer 20 be preheated to approximately 200° C. This process enhances resistance of the resist layer 20 against strong alkaline solutions. The resist layer 20 may be irradiated with ultraviolet rays in order to prevent thermal deformation of the resist layer 20. In order to deposit zinc on the surface of the pads 12, the pads 12 may be immersed into an alkaline zinc solution, the substituted zinc may be dissolved with nitric acid, and then the pads 12 may be immersed into the alkaline zinc solution. Next, an electroless nickel plating solution is provided on the pads 12 of which the surfaces are zinc-substituted to form nickel first metal layers 30 on the pads 12 by a substitution reaction between zinc and nickel.

Prior to the zincate treatment of the pads 12, the residue of the insulating film 14 of the semiconductor chip 10 is preferably dissolved using a predetermined solution (for example, a week hydrofluoric acid solution). Moreover, it is preferable that the pads 12 be immersed into an alkaline solution after the residue of the insulating film 14 is removed, in order to remove the oxide films at the exposed portions of the pads 12. By these procedures, the surfaces of the pads 12 can be successfully aluminum-substituted.

When the first metal layers 30 are formed on the pads 12 by the zincate treatment, the zinc layer may remain on the aluminum (pad 12). In such a case, the first metal layers 30 also contain zinc layers.

Alternatively, a reducing solution containing palladium or the like is provided on the aluminum pads 12 instead of the zincate treatment, and then into an electroless nickel plating solution so that nickel first metal layers 30 are deposited from palladium crystal nuclei on the pads 12. In general, nickel can be formed within a shorter time compared to gold. The first metal layer 30 may have a thickness of approximately 15 to 25 $\mu$m.

As shown in FIG. 3(B), the resist layer (inner leads) 20 are removed. As shown above, the first metal layers 30 are formed based on the shape of the through holes 22. That is, the first metal layers 30 are formed in the height direction with suppressed spreading in the lateral (width) direction regardless of application of electroless plating causing isotropic metal growth. Accordingly, when a plurality of pads 12 having a narrow pitch is formed, bumps can be formed on the corresponding pads 12 without short-circuit between adjacent pads 12.

As shown in FIG. 3(C), second metal layers 32 may be formed on the first metal layers 30, if necessary. The second metal layers 32 are formed so as to cover the first metal layers 30. Oxidation of the second metal layers 32 (nickel layers) can be thereby avoided. The second metal layers 32 formed after removing the resist layer 20 may be a single layer as shown in FIG. 3(C) or may be formed of a plurality of layers. At least the surface layers of the second metal layers 32 may be formed of gold. Gold further ensures electrical connection with a wiring pattern etc. When the first metal layers 30 are formed of nickel, an electroless gold solution may be provided on the first metal layers 30 (nickel layers) to form second metal layers 32 (gold layers) thereon.

When the semiconductor chip 10 is immersed into a predetermined solution to form the first metal layers 30 and the second metal layers 32 by electroless plating, the back surface and the side faces of the semiconductor chip 10 may be preliminarily covered with a protective film. The protective film may be a resist layer. The resist layer may be a non-photosensitive resist. The resist layer may be formed on the back surface and the side faces in a thickness of approximately 2 $\mu$m. It is preferable that light be shaded when the semiconductor chip 10 is immersed in the solution. This prevents a change in potential between electrodes in the solution when the semiconductor chip 10 is immersed into the solution. Thus, treatments such as metal plating by electroless plating on each pad 12 can be uniformalized.

When the pads 12 are formed of a copper-containing material, for example, a reducing solution containing palladium or the like may be provided on the pads 12 and then into an electroless nickel plating solution to form nickel layers (first metal layers 30) from palladium crystal nuclei.

The above-described metals and solutions are merely disclosed as exemplary embodiments, and are not intended to limit the scope of the invention. For example, copper (Cu) may be used as a metal used in electroless plating.

According to the present invention, using the resist layer 20, the openings 16 are formed in the insulating film 14, and the metal layers (first metal layer 30 and second metal layers 32) connected to the pads are formed; hence, the bumps are formed by simplified steps. When the metal layers (for example, the first metal layers 30) are formed in the through holes 22 in the resist layer 20, bumps can be formed into a shape corresponding to the size of the through holes 22, that is, into a desired width.

By the above steps, as shown in FIG. 4, a bump 40 formed of the first metal layer 30 and the optional second metal layer 32 (not shown) is formed on each pad 12 of the semiconductor chip 10. The semiconductor chip 10 as a flip chip can be face-down-bonded to a substrate. In such a case, a wiring pattern (a land) formed on the substrate and the bump 40 is electrically connected to each other. For electrical connection, conductive particles may be disposed between the bump 40 and the wiring pattern using an anisotropic conductive material, such as an anisotropic conductive film (ACF) or an anisotropic conductive paste (ACP). Alternatively, the bump 40 and the wiring pattern (particularly the land) may be electrically connected by metallic connection of Au—Au, Au—Sn, or an solder (containing solder) or by shrinkage of an insulating resin.

Second Embodiment

FIGS. 5(A) to 6(B) show a method for forming a bump in accordance with a second embodiment of the present invention. In this embodiment, a separate description of elements that are similar to elements of the first embodiment is not provided. In the following embodiments, including this embodiment, similar elements of other embodiments are used as much as possible.

As shown in FIG. 2(A) for the former embodiment, the resist layer 20 having the through holes 22 is formed, and then, as shown in FIG. 5(A), parts of the insulating film 14 are removed through the through holes 22. In this embodiment, the openings 18 in the insulating film 14 are larger than the through holes 22 in the resist layer 20. For example, parts of the insulating film 14 may be removed by isotropic etching to form such openings 18. The openings 18 may be formed, as shown in FIG. 5(A), so that the size thereof does not protrude from the periphery of the pads 12.

As shown in FIG. 5(B), first metal layers 30 are formed in the through holes 22. Since the size of the openings 18 are larger than the through holes 22 in plan view in this case, the first metal layer 30 may be not easily formed at a portion protruding from the through hole 22 in the opening 18. Thus, as shown in FIG. 6(A), an exposed portion 13 from the insulating film 14 may be formed at the periphery of the first metal layer 30 on the pad 12 when the resist layer 20 is removed. In this embodiment, as shown in FIG. 6(B), the resist layer 20 is removed and then the second metal layers 32 are formed to cover the exposed portions 13.

For example, the second metal layer 32 includes inner and outer layers 34 and 36, respectively, and as shown in FIG. 6(B), the inner layer 34 may cover the surface of the exposed portion 13. The inner layer 34 may be formed of the same material as that for the first metal layer 30 and may be formed of, for example, nickel (Ni), copper (Cu), gold (Au), or the like. Bumps can thereby be formed without the surface of the pads 12 being exposed. The outer layer 36 may be formed of gold.

Alternatively, the exposed portion 13 may be covered with a single second metal layer 32. In such a case, the second metal layer 32 may be formed of nickel (Ni), copper (Cu), or gold (Au).

The semiconductor device in accordance with this embodiment includes a semiconductor chip 10 having pads 12, an insulating film 14, and bumps having first and second metal layers 30 and 32.

The insulating film 14 has openings 18 in the centers of the pads 12 and is formed so as to cover from the surface of the semiconductor chip 10 to the end of each pad 12. The first metal layers 30 are formed at the inner side of the openings 18, and at least parts of the second metal layers 32 are formed between the first metal layers 30 and the openings 18. As shown in FIG. 6(B), the second metal layers 32 cover the surfaces of the first metal layers 30, and parts thereof may be formed between the first metal layers 30 and the openings 18. Alternatively, the second metal layers 32 may be formed only between the first metal layers 30 and the openings 18. In these cases, bumps can be formed without the pads 12 being exposed.

Third Embodiment

FIG. 7(A) to FIG. 8(B) show a method for forming a bump in accordance with a third embodiment of the present invention.

In this embodiment, as shown in FIG. 7(A), a semiconductor chip 10 provided with an insulating layer 15 is prepared. The insulating layer 15 is thinner at a portion which covers the center of each pad 12 than at a portion which covers the surface of the semiconductor chip 10 and the end of the pad 12. The insulating layer 15 may be formed of a single layer or a plurality of layers. For example, as shown in FIG. 7(A), the insulating layer 15 may be formed of an upper layer 50 and a lower layer 60. In this case, the lower layer 60 has openings 62 in the central portions of the pads 12 and covers the surface of the semiconductor chip 10 and the ends of the pads 12. The upper layer 50 is formed on the lower layer 60 and the central portion of each pad 12. In such a manner, a thin portion 17 of the insulating layer 15 may be formed in the central portion of each pad 12.

As shown in FIG. 7(A), a resist layer 20 having through holes 22 is formed on the insulating layer 15 of the semiconductor chip 10. Each through hole 22 may be formed at the inner side of the periphery of the pad 12 and at the outer side of the thin portion 17 of the insulating film 15. When the insulating layer 15 is formed of the upper layer 50 and the lower layer 60, the wall of each through hole 22 may be formed above a portion, which covers the end of the corresponding pad 12, of the lower layer 60. When the portion of the insulating layer 15 in the through hole 22 is removed, the opening is readily formed in the insulating layer 15 so as not to be larger than the through hole 22. In detail, etching is performed and the throughput for removing at least a part of the thin portion 17 of the insulating layer 15 without removing the thicker portion of the insulating layer 15. As a result, the opening is formed in the insulating layer 15 so as not to be larger than the through hole 22.

Alternatively, each through hole 22 may be formed within the thin portion 17 of the insulating layer 15. In this case, at least a part of the thin portion 17 of the insulating layer 15 in the through hole 22 is removed, so that the opening in the insulating layer 15 is not larger than the through hole 22.

Alternatively, each through hole 22 may be formed on the periphery and the outer region of the pad 12. In such a through hole 22, the insulating layer 15 is removed without removing, for example, a portion of the insulating layer 15 covering the end of the pad 12 (for example the lower layer 60), so that a bump is formed without exposing the semiconductor chip 10 and the pad 12 from the insulating layer 15.

As shown in FIG. 7(B), a part of the insulating layer 15 is removed through each through hole 22. The opening of the insulating layer 15 may be formed so that the size thereof exceeds the size of the corresponding through hole 22. For example, the switching element opening 52 of the upper layer 50 may be formed so as to exceed the size of the through hole 22. When the opening 62 of the lower layer 60 is formed so as not to be larger than the through hole 22 in such a case, the first metal layer 30 formed in a subsequent step can be formed without exposing the surface of the pad 12. When the opening 62 of the lower layer 60 is formed so as to be larger than the through hole 22, at least a part of a second metal layer (not shown in the drawing) may be formed at an exposed portion at the periphery of the first metal layer 30 in the pad 12 after removing the resist layer 20 to cover the exposed portion.

Alternatively, the opening of the insulating layer 15 may be formed so as not to is larger than the through hole 22.

When the insulating layer 15 is formed of the upper layer 50 and the lower layer 60, openings 52 and 62 of these layers may be formed so as not to be larger the through hole 22.

As shown in FIG. 8(A), a first metal layer 30 is formed in each through hole 22. When the opening 62 of the lower layer 60 is formed so as not to be larger than the through hole 22 and the opening 52 of the upper layer 50 is formed so as to be larger than the through hole 22, the first metal layer 30 can be formed so that the end thereof lies on the lower layer 60. Accordingly, the thickness of the portion of the insulating layer 15 under the end of the first metal layer 30 can be reduced. The step difference caused by the insulating layer 15 under the end of the bump is thereby reduced, ensuring electrical connection between the bump and the pad 12.

As shown in FIG. 8(B), the resist layer 20 is removed. The first metal layer 30 is formed so that the end thereof lies on the insulating layer 15 (the lower layer 60). The first metal layer 30 is thereby formed without exposing the pad 12. In addition, a second metal layer (not shown in the drawing) may be formed on the surface of the first metal layer 30. When the opening 52 of the upper layer 50 and the opening 62 of the lower layer 60 have different sizes, an end of the second metal layer may be formed to cover an exposed end of the lower layer 60 and abut an end of the upper layer 50. The step difference due to the insulating layer 15 under the end of the bump formed of the first metal layer 30 and the second metal layer is moderated stepwise to ensure electrical connection between the bump and the pad 12. When an exposed portion from the insulating layer 15 is formed around the first metal layer 30, the second metal layer may be formed so as to cover the exposed portion.

The semiconductor device according to this embodiment includes the semiconductor chip 10 having the pads 12, the insulating layer 15, and bumps formed on the pads 12.

The insulating layer 15 has openings formed in the centers of the pads 12 and covers the surface of the semiconductor chip 10 and the end of each pad 12. Each bump is larger than the corresponding opening of the insulating layer 15 so that the end of the bump lies on the insulating layer 15. The bump may have the first metal layer 30, as described above. Moreover, the bump may have a second metal layer surrounding the first metal layer 30. The insulating layer 15 has a thin portion below the end of the bump and a thick portion on the surface of the semiconductor chip 10. For example, as shown in FIG. 8(B), a part of the lower layer 60 of the insulating layer 15 having a plurality of layers may extend below the end of the first metal layer 30.

Accordingly, the surface of the semiconductor chip 10 is covered with the thick portion, whereas the insulating layer 15 has a thin portion below the end of the bump. Since the surface of the semiconductor chip 10 is covered with the thick layer, the semiconductor chip 10 exhibits enhanced moisture resistance. Since the step difference due to the insulating layer 15 below the end of the bump is reduced, reliability of connection between the pad 12 and the bump is enhanced.

Fourth Embodiment

FIG. 9 shows a semiconductor device in accordance with the present invention. The semiconductor device 1 shown in FIG. 1 includes the above-described semiconductor chip 10 having the bumps (for example the bumps 40 shown in FIG. 3(C)) formed on the pads 12, a substrate 70 provided with a wiring pattern 72, and a plurality of external terminals 80.

In this case, the semiconductor chip 10 is face-down-bonded to the substrate 70. The semiconductor chip 10 and the substrate 70 are bonded to each other with material 74. The bumps 40 and the wiring pattern 72 are electrically connected with conductive particles.

The substrate 70 is provided with a plurality of external terminals 80. The external terminals 80 are electrically connected to the wiring pattern 72 via through holes (not shown in the drawing) or the like. Each external terminal 80 may be spherical solder. Alternatively, the external terminals 80 may be formed by printing a solder pattern and then by reflowing the pattern. The external terminals 80 may be formed of copper instead of the solder. Alternatively, a solder cream, which is applied to a mother board, is melted so that the melted cream functions as external terminals by surface tension thereof, instead of the formation of the external terminals 80. This semiconductor device is of a so-called land grid array type.

Fifth Embodiment

FIG. 10(A) to FIG. 10(C) show a method for forming a bump in accordance with a fifth embodiment.

In this embodiment, a first metal layer 30 is formed as shown in FIG. 3(A), and then a second metal layer 33 is formed without removing the resist layer 20 as shown in FIG. 10(A). That is, the second metal layer 33 is formed on the first metal layer 30. The second metal layer 33 may be formed of a single layer or a plurality of layers. The second metal layer 33 may be formed of gold (Au). When the second metal layer 33 is formed of a plurality of layers, at least the surface layer may be formed of gold. The thickness of the second metal layer 33 may be in the range of 0.1 to 0.2 μm. The second metal layer 33 may be formed by electroless plating.

The resist layer 20 is removed as shown in FIG. 10(B). A metal layer 42 including the first metal layer 30 and the second metal layer 33 is thereby formed.

As shown in FIG. 10(C), a solder 44 is provided on the metal layer 42, if necessary. The solder 44 is used for electrical connection of the semiconductor chip 10 with leads (including wiring) not shown in the drawing. The solder 44 may be either soft solder or hard solder, and may be, for example, solder or a conductive paste.

Preferably, the second metal layer 33 is formed of a material having higher wettability with the solder 44 compared to the first metal layer 30. When solder is used as the solder 44, the second metal layer 33 is preferably formed of a material having higher wettability with the solder compared to the first metal layer 30. For example, at least the surface of the second metal layer 33 may be formed of gold. The solder 44 is thereby satisfactorily provided on the second metal layer 33. The material for the second metal layer 33 is not limited to gold and may be any other metal having high wettability with the solder 44.

A solder may be formed on the metal layer 42 by a dipping process in which the upper face of the metal layer 42 (second metal layer 33) is dipped into a solder bath. In this case, the solder readily adheres to the Au layer (second metal layer 33) and the solder is provided on the metal layer 42. Alternatively, the metal layer 42 may be placed into contact with the surface of melted solder so that the solder adheres to the second metal layer 33. Alternatively, the solder may be provided on the metal layer 42 by a printing process or an ink jet process. The solder may be formed of a material containing tin (Sn) and silver (Ag). The height of the solder provided on the metal layer 42 may be within the range of, for example, approximately 10 to 20 μm. The bump in this embodiment includes the metal layer 42 (the first metal layer 30 and the second metal layer 33) and the solder 44.

The solder 44 may contain tin (Sn). Alternatively, the solder 44 may contain tin (Sn) and at least one metal selected from silver (Ag), copper (Cu), bismuth (Bi), and zinc (Zn). The thickness of the solder 44 is adjusted so that adjacent bumps are not short-circuited. When the surface of a component (for example, a lead) connecting to the bump is composed of Au, the thickness of the solder 44 is set to be approximately 0.1 to 3 μm to form a Sn—Au eutectic crystal bond having adequate bonding strength. In the thickness in this range, short-circuiting between the bumps is prevented, even if the distance between two adjacent bumps is extremely small (for example approximately 7 μm).

Alternatively, the solder 44 (the second metal layer) may be provided directly on the first metal layer 30. That is, the bump includes the first metal layer 30 and the solder 44. For example, the solder 44 is applied to the nickel layer (the first metal layer 30) to form a bump. The solder 44 may be formed so as to cover the entire first metal layer 30 or may be formed on the first metal layer 30.

In this embodiment, the metal layer 42 has the second metal layer 33 thereon. When the second metal layer 33 is formed of a material having high wettability with the solder 44, the amount of the solder 44 provided on the metal layer 42 can be optimized. Specifically, the solder 44 may be provided only on the upper face of the metal layer 42. When the solder 44 is melted, the solder 44 is prevented from the side faces of the metal layer 42 in the lateral direction. When a plurality of pads 12 are arranged at a narrow pitch, short-circuiting between the pads 12 by the melted solder 44 is avoided.

Sixth Embodiment

FIG. 11(A) and FIG. 11(b) show a method for forming a bump in accordance with a sixth embodiment. With reference to FIG. 11(B), a bump 46 formed by this process includes metal layers (a first metal layer 30 and a second metal layer 33) and a solder 44. In this embodiment, the solder 44 is provided so that a resin layer 24 is formed around the metal layers (the first metal layer 30 and the second metal layer 33).

As shown in FIG. 11(A), the first metal layer 30 and the second metal layer 33 are formed. Without removing the resist layer 20, the second metal layer 33 may be formed on the first metal layer 30. Alternatively, the second metal layer 33 may be formed so as to cover the first metal layer 30 after the resist layer 20 is removed. The second metal layer 33 may be formed of a material having higher wettability with the solder 44 compared to the first metal layer 30. In other words, the second metal layer 33 may be formed of a material which facilitates adhesion of the solder 44 compared to the first metal layer 30.

As shown in FIG. 11(B), the solder 44 is provided on the metal layers (the first metal layer 30 and the second metal layer 33). This step is performed by providing the resin layer 24 around the metal layers (the first metal layer 30 and the second metal layer 33).

The resin layer 24 is not provided on a part of each metal layer (the first metal layer 30 or the second metal layer 33) formed on the pad 12. In detail, the resin layer 24 is provided so that at least a part of the second metal layer 33 is exposed. The resin layer 24 may be provided so that the resin layer 24 is not formed on the metal layers (the first metal layer 30 and the second metal layer 33). As shown in the drawing, the resin layer 24 is provided so as to substantially be flush with the metal layer (the first or second metal layer).

The resin layer 24 may be formed around the metal layers (the first metal layer 30 and the second metal layer 33) after the resist layer 20 is removed. Alternatively, the resist layer 20 may be left and used instead of the resin layer 24. In the latter case, the resist layer 20 is used in both the steps of forming the metal layers (at least the first metal layer 30) and of forming the brazing alloy 44; hence, the process is simplified. When the resist layer 20 is used instead of the resin layer 24, the second metal layer 33 is preferably formed so as to substantially be flush with the resist layer 20.

The resin layer 24 may be formed by a photolithographic process, etching, screen printing, an ink jet process, or application with a dispenser. For example, a polyimide resin may be applied on the surface provided with the pads 12 of the semiconductor chip 10 other than the plurality of metal layers (the first metal layer 30 and the second metal layer 33) so as to be substantially flush with the upper face of the metal layers. The upper face of the metal layers (the first metal layer 30 and the second metal layer 33) may be exposed by etching or the like, if necessary. When the upper face of the metal layers (the first metal layer 30 and the second metal layer 33) is exposed by etching or the like, the thickness of the resin layer 24 may be slightly smaller than the thickness (height) of the metal layers (the first metal layer 30 and the second metal layer 33).

After the resin layer 24 is formed, the solder 44 is provided on the metal layers (the first metal layer 30 and the second metal layer 33). The solder 44 may be formed of any one of the above-mentioned materials, for example, solder (e.g., an alloy containing tin, silver, and copper). The solder 44 may be provided so that at least faces exposed from the resin layer 24 of the metal layers (the first metal layer 30 and the second metal layer 33) come into contact with the surface of the melted solder. When the second metal layer 33 is formed of a material having high wettability with the solder 44 in this case, the solder 44 can be securely provided on the second metal layer 33. The height of the solder provided on the metal layers (the first metal layer 30 and the second metal layer 33) may be, for example, in the range of approximately 10 to 20 μm.

Since the resin layer 24 is not wettable to the solder (repels the solder), an optimum amount of solder can be provided only on the exposed surface of the metal layers (the first metal layer 30 and the second metal layer 33). In detail, a small amount of solder is provided so that the solder does not spread around the pad 12 when a semiconductor chip is mounted. Accordingly, the lateral spread of the solder (solder 44) from the side faces of the metal layers (first metal layer 30 and the second metal layer 33) is prevented. When a plurality of pads 12 are arranged at a narrow pitch, the pads 12 do not cause short-circuiting by the melt solder 44.

Seventh Embodiment

FIG. 12(A) and FIG. 12(B) show a method for forming a bump in accordance with a seventh embodiment of the present invention. In this embodiment, the shape of the first metal layer 90 differs from the above embodiments.

As shown in FIG. 12(A), the first metal layer 90 is formed so as to be higher than the height of the through hole 22 in the resist layer 20 and to extend towards the periphery. In other words, the first metal layer 90 overflows from the through hole 22. When the first metal layer 90 is formed by electroless plating, the thickness may be controlled by the operation temperature, the operation time, the volume and pH of the plating solution, and the number of plating cycles (turn numbers).

The first metal layer 90 extends in all directions over the through hole 22. That is, the first metal layer 90 extends not only in the height direction but also the lateral direction over the through hole 22. The first metal layer 90 is thereby formed so as to exceed the width of the through hole 22.

Next, a second metal layer 92 is formed. As shown in the drawing, the second metal layer 92 may be formed without removing the resist layer 20. In such a case, the second metal layer 92 is formed on the tip of the first metal layer 90 (the outer portion of the through hole 22). Alternatively, the second metal layer 92 may be formed after the resist layer 20 is removed. In such a case, the second metal layer 92 is formed so as to cover the surface of the first metal layer 90. The shapes of the first metal layer 90 and the second metal layer 92 and the methods for forming the layers are the same as those in the former embodiments.

As shown in FIG. 12(B), the resist layer 20 is removed. Bumps 100 (the first metal layers 90 and the second metal layers 92) are thereby formed. Each bump 100 includes a body 94 and a tip 96.

The body 94 of each bump 100 is connected to the corresponding pad 12. The body 94 is shaped like a pillar (e.g., cylindrical or prismatic). The body 94 is formed so as correspond to the shape of the through hole 22. When the through hole 22 is formed so as not to exceed the pad 12, the body 94 is formed inside the pad 12 in plan view of the semiconductor chip 10. The thickness (height) of the body 94 is formed in response to the height of the through hole 22 in the resist layer 20.

The tip 96 of the bump 100 is connected to the body 94. The width of the tip 96 is larger than the width of the body 94. When the body 94 is rectangular in plan view of the semiconductor chip 10, the tip 96 is formed so as to protrude from at least one side (preferably all the sides) of the body 94. The tip 96 of a bump 100 formed on one pad 12 may protrude toward the direction of an adjacent pad 12 and in another direction in different lengths, in plan view of the semiconductor chip 10. For example, the tip 96 may extend a length from the body 94 toward an adjacent pad 12 that is shorter than the tip 96 extends in another direction. This configuration prevents the tips 96 of adjacent pads 12 from electrically contacting each other. The tip 96 may have a width which is larger than the width of the pad 12, or may have a width which is larger than the width of the body 94 and smaller than the width of the pad 12.

The solder 44 is provided on the bump 100 (metal layer). The solder 44 is described above, and may be formed of solder. The method for forming the solder 44 is described above. Since the tip 96 is larger than the body 94, the bump 100 has a portion protruding from the body 94 at the tip 96 and a space 98 thereunder for holding the solder 44. For example, the space 98 may be formed at a reentrant portion which is formed by a face of the tip 96 facing the pad 12 and the side face of the body 94. Since the excess volume of solder 44 on the bump 100 is held in the space 98, the solder 44 does not flow toward the adjacent pad 12. The shapes (the width of the metal layer etc.) of the body 94 and the tip 96 may be determined without restriction as long as the solder 44 is easily held.

In addition to the embodiment shown in FIG. 12(A) and 12(B), the second metal layer 92 may be formed so as to overflow from the through hole 22. That is, the first metal layer 90 may be formed so as not to protrude from the resist layer 20, and the second metal layer 92 may be formed so as to protrude from the resist layer 20 without removing the resist layer 20. Also, such a case has the above advantages.

Although the bump 100 includes the first metal layer 90 and the second metal layer 92 in the above embodiment, the bump 100 may include the solder 44, in addition to the first metal layer 90 and the second metal layer 92.

According to this embodiment, the first metal layer 90 is formed so as to overflow from the through hole 22, and the tip has a width larger than that of the through hole 22. The space 98 which holds a portion of the solder 44 is thereby formed on the bump 100. Accordingly, pads 12 can be provided without mutual short-circuiting, since the solder 44 does not spread toward the periphery of the bump 100 (metal layer).

Next, a semiconductor device in accordance with this embodiment will be described. The semiconductor device includes a semiconductor chip 10 having a plurality of pads 12 and bumps 100, each having a body 94 and a tip 96.

The bump 100 is described above. The tip 96 can be formed of both a first metal layer 90 and a second metal layer 92 or of only a second metal layer 92. The second metal layer 92 may be formed on only the tip 96, or on the tip 96 and the body 94. The shapes and the sizes of the tip 96 and the body 94 are not limited.

The bump 100 has a space 98 for holding the solder 44. In detail, the bump 100 has the space 98 in which a portion of the solder 44 is held when the alloy is melted. The shape of the space 98 is not limited and may be at a reentrant portion formed by a face of the tip 96 and a face of the body 94.

According to the semiconductor device of this embodiment, when the semiconductor chip 10 is mounted onto an interposer (substrate) or the like with the solder 44, the melted solder 44 can be held in the space 98 without overflow towards the adjacent pads 12. Even if a plurality of pads 12 are arranged at a narrow pitch, these pads 12 are not mutually short-circuited. Accordingly, a highly reliable semiconductor device is provided.

Eighth Embodiment

FIG. 13(A) to FIG. 16(B) show a method for forming a bump in accordance with an eighth embodiment of the present invention. FIG. 16(A) and FIG. 16(B) show a modification of this embodiment. In this embodiment, a second metal layer 180 is formed by electroplating.

As shown in FIG. 13(A), a conductive film 170 is formed on the insulating film 14 provided on the semiconductor chip 10. The conductive film 170 is used as a plating lead for forming the second metal layer 180 by electroplating. The conductive film 170 has a predetermined pattern and extends at least from above each pad 12 to above the insulating film 14. In detail, the conductive film 170 extends from each pad 12 towards the periphery of the semiconductor chip 10, in plan view of the semiconductor chip 10. The conductive film 170 may be formed on the insulating film 14 so as to cover each pad 12. That is, the conductive film 170 may be formed as a land based on the position of each pad 12. Alternatively, the conductive film 170 may be formed as a continuous plane extending on each pad 12. The thickness of the conductive film 170 can be determined without restriction in view of electrical connection with a first metal layer 30 (formed later), and may be, for example, approximately 50 to 200 nm. The conductive materials for the conductive film 170 are not limited and may be nickel (Ni), chromium (Cr), tungsten (W), and platinum (Pt). Furthermore, the methods for forming the conductive film 170 are not limited and may be formed by, for example, sputtering process and an evaporation process.

As shown in FIG. 13(B), a resist layer 20 is formed on the pattern of the conductive film 170. The resist layer 20 is formed on the entire surface of the semiconductor chip. That is, the resist layer 20 is formed not only on the conductive film 170 but also on the gas exhaust pipe that is not provided with the conductive film. When the conductive film 170 is formed as a land above each pad 12, a through hole 22 is formed in the resist layer 20 so that the periphery of the through hole 22 lies inside of the land. When an opening 172 is formed in the conductive film 170 according to the planar shape of the through hole 22, the conductive film 170 and the first metal layer 30 can be electrically connected. The thickness of the resist layer 20 is not limited and may be in the range of, for example, approximately 15 to 40 $\mu$m.

As shown in FIG. 13(C), an opening 16 in the insulating film 14 and the opening 172 in the conductive film 170 are formed inside each through hole 22. The opening 16 and the opening 172 communicate to expose at least a part of the pad 12 inside the through hole 22. The opening 16 and the opening 172 may be formed by etching. The etching may be a wet etching process or a dry etching process. The insulating film 14 and the conductive film 170 may be simultaneously etched. Alternatively, after forming the opening 172 in the conductive film 170, the opening 16 may be formed in the insulating film 14. The opening 16 and the opening 172 may have the same size which is substantially the same as the perimeter of the through hole 22, or may have a size which does not exceed the perimeter of the through hole 22.

As shown in FIG. 14(A), the first metal layer 30 is formed. The first metal layer 30 may be formed by electroless plating. The first metal layer 30 has a height in the through hole 22 so as to connect to the conductive film 170. For example, the first metal layer 30 is thicker than the total thickness of the insulating film 14 and the conductive film 170. The first metal layer 30 is thereby connected to the conductive film 170 at the perimeter of the through hole 22. The first metal layer 30 may be lower than the resist layer 20. When a second metal layer 180 is formed by electroplating, in such a case, the second metal layer 180 is formed so as to have a width of the through hole 22. That is, by suppressing the isotropic growth of the second metal layer 180, the second metal layer 180 having a predetermined width can be formed on the first metal layer 30. The thickness (height) of the first metal layer 30 is not limited and may be within the range of, for example, approximately 1 to 30 μm.

The first metal layer 30 may be formed of a plurality of layers. When the second metal layer 180 is formed of a solder, the upper layer of the second metal layer 180 in contact with the first metal layer 30 may be formed of a material which has a higher affinity with the solder, compared to the lower layer in contact with the pad 12. For example, the upper layer of the first metal layer 30 may be formed of gold.

As shown in FIG. 14(B), the second metal layer 180 is formed. The second metal layer 180 is formed by electroplating. In detail, the second metal layer 180 in contact with the first metal layer 30 is formed by electroplating using the conductive film 170 electrically connecting to the first metal layer 30 as an electrode. The second metal layer 180 may be substantially flush with the resist layer 20 as shown in the drawing, or may be lower than the resist layer 20.

The second metal layer 180 may be formed of a solder. That is, the solder may be formed on the first metal layer 30 provided by electroplating. The solder is described above and may be solder. The composition of the solder is not limited and may be Sn, Sn—Pb, Sn—Ag, Sn—Cu, Sn—Ag—Cu, or Sn—Zn. Electroplating of solder can suppress a variation in the composition of the resulting layer compared to electroless plating thereof. Thus, a variation of the melting temperature of the solder can be suppressed. Since the first metal layer 30 is formed by a simple electroplating process, the metal layer can be more readily formed compared with the formation by electroplating.

As shown in FIG. 14(C), the resist layer 20 is removed. After the resist layer 20 is removed, the conductive film 170 on the insulating film 14 is exposed.

The conductive film 170 is removed as shown in FIG. 15(A). The conductive film 170 may be removed by wet etching, dry etching or the like. Since the conductive film 170 is removed after the second metal layer 180 is formed, a thick bump 102 may be preliminarily formed.

As shown in FIG. 15(B), after the resist layer 20 and the conductive film 170 are removed, a reflow step may be introduced, if necessary. The reflow step may be performed after flux coating, or may be performed in a nitrogen atmosphere without flux coating. When a flux is used, it is preferable to introduce a cleaning step after the reflow step. The reflow step is not limited and may use any reflow furnace, such as an infrared furnace, a far infrared furnace, or an air heating furnace. The reflow step may be performed by spot irradiation or continuous irradiation with laser or halogen light. In the above embodiment, the reflow step is performed after the resist layer 20 is removed. Alternatively, the reflow step may be performed without removing the resist layer 20. In such a case, the resist layer 20 is removed after the reflow step.

A bump 102 including the first metal layer 30 and the second metal layer 180 is thereby formed on each pad 12. Accordingly, bumps having reliable connection can be formed by a simplified process.

A modification in this embodiment will be described. As shown in FIG. 14(A), the first metal layer 30 is formed and then, as shown in FIG. 16(A), a second metal layer 182 is formed so as to overflow from the through hole 22. That is, the second metal layer 182 is higher than the resist layer 20. As shown in FIG. 16(B), the resist layer 20 is removed and a reflow step is introduced, if necessary. A bump 104 including the first metal layer 30 and the second metal layer 182 is thereby formed on each pad 12. This modification also exhibits the above advantages.

Ninth Embodiment

FIG. 17(A) to FIG. 18(B) show a method for forming a bump in accordance with a ninth embodiment of the present invention. In this embodiment, a second metal layer 184 is formed by a printing process.

As shown in FIG. 17(A), an opening 16 is formed in an insulating film 14 through a through hole 22 in a resist layer 20. At least a part of each pad 12 is thereby exposed.

As shown in FIG. 17(B), a first metal layer 30 is formed. The first metal layer 30 is formed by electroless plating. The first metal layer 30 is lower than the resist layer 20. In detail, the first metal layer 30 is formed so that a second metal layer 184 having a height which does not exceed the through hole 22 can be formed in a subsequent step.

The first metal layer 30 may be formed of a plurality of layers. When the second metal layer 184 is formed of a solder, the upper layer of the first metal layer 30, connected to the second metal layer 184, may be formed of a material which has high affinity with the solder, compared with the lower layer connecting to the pad 12. For example, the upper layer of the first metal layer 30 may be formed of gold.

As shown in FIG. 17(C), the second metal layer 184 is formed by a printing process. In this case, the resist layer 20 is used as a printing mask. That is, a step difference caused by the first metal layer 30 which is lower than the resist layer 20 is used as an opening of the mask. The second metal layer 184 may be formed of a solder such as the above-described solder. For example, a solder paste is placed into the resist layer 20 and is loaded into the through hole 22 by a squeegee (not shown in the drawing). The thickness of the second metal layer 184 (for example, a solder) is determined in view of the thickness of the resist layer 20 and the thickness of the first metal layer 30.

As shown in FIG. 18(A), a reflow step is performed. The reflow step may be performed without removing the resist layer 20. For example, the second metal layer 184 is melted by, for example, laser light so that the second metal layer 184 becomes hemispherical by surface tension.

As shown in FIG. 18(B), the resist layer 20 is removed. The second metal layer 184 is surely formed on the first metal layer 30 by removing the resist layer 20. When a general printing mask is used, the mask must be removed by a mechanical process, arising problems of mask releasability and a change in the amount of the coated material due to diffusion into the mask. Since the resist layer is used as a mask in this case, these problems do not occur.

In the above embodiment, the reflow step is performed without removing the resist layer 20. Alternatively, the reflow step may be performed after the resist layer 20 is removed.

Since no printing mask is formed according to this embodiment, the second metal layer 184 can be provided by reduced steps. Since no metal mask is used, the number of components used in the production process can be reduced, and it is not necessary that the snap-off of the mask be taken into consideration.

Tenth Embodiment

FIG. 19 shows a semiconductor device in accordance with a tenth embodiment of the present invention. The semiconductor device 3 includes the semiconductor chip 10 having bumps (described in the ninth embodiment), a substrate 70 provided with a wiring pattern 72, and a plurality of external terminals 80. The semiconductor chip 10 is face-down-mounted onto the substrate 70, and a resin as an under-filling material is loaded between the semiconductor chip 10 and the substrate 70.

Each bump includes a first metal layer 30 (for example, a nickel layer or a copper layer) and a second metal layer 184 (for example, solder). The first metal layer 30 on the pad 12 and leads of the wiring pattern 72 are soldered with the second metal layer 184. The semiconductor chip 10 includes a solder having high connection reliability. Thus, a highly reliable semiconductor device is provided at reduced cost.

This embodiment of the semiconductor device is also applicable to semiconductor chips 10 provided with glassy alloys which are shown in the above-described embodiments.

Eleventh Embodiment

FIG. 20(A) and FIG. 20(B) show a method for forming a bump in accordance with an eleventh embodiment. In this embodiment, the configuration of a second metal layer 110 differs from the above embodiments. The second metal layer 110 may be formed of a plurality of layers. In the drawings, the second metal layer 110 includes first and second sublayers 112 and 114.

As shown in FIG. 20(A), the first sublayer 112 is formed on a first metal layer 30. The first sublayer 112 is preferably formed so as to cover the first metal layer 30. Alternatively, the first sublayer 112 may be formed on the first metal 20 layer 30 using a resist layer. The first sublayer 112 may be formed, after the first metal layer 30 is formed in a through hole in the resist layer and the resist layer is removed. The first metal layer 30 is described in the above embodiments and may be, for example, a nickel (Ni) layer. The first sublayer 112 may be a gold (Au) layer. For example, a gold plating solution is provided on the first metal layer 30 (Ni layer) to deposit Au on the Ni layer by substitution. In this case, the semiconductor chip 10 may be immersed into the gold plating solution. The thickness of the first sublayer 112 (Au layer) may be, for example, approximately 0.1 to 0.2 µm.

As shown in FIG. 20(B), a second sublayer 114 is formed on the first sublayer 112. The second sublayer 114 may be a gold layer (Au layer). For example, the second sublayer 114 (Au layer) may be formed by an autocatalytic plating in a gold plating solution containing a predetermined reducing agent. When the semiconductor chip 10 is immersed into the solution, the semiconductor chip 10 is preferably shaded from light. Regarding the thickness of the second sublayer 114 (Au layer), the total thickness of the first sublayer 112 and the second sublayer 114 is preferably 0.3 to 0.7 µm.

A bump 120 including the first metal layer 30 and the second metal layer 110 is thereby formed. The bump 120 is provided with the outer Au layers (the first sublayer 112 and the second sublayer 114).

According to this embodiment, the Au layer (second metal layer 110) including a plurality of layers can have a large thickness. Thus, the bump 120 of nickel (first metal layer 30) coated with the Au layer (second metal layer 110) can be directly connected to, for example, a lead (without using a solder) as in the case for forming the bump 120 using only gold.

In this embodiment, the method for making the second metal layer 110 is not limited to the above method as long as the thickness lies in the range of 0.3 to 0.7 µm. For example, the first sublayer 112 may be formed using a reducing agent (by autocatalytic plating) by appropriately determining the composition of the plating bath.

The method for making the first metal layer 30 in the through hole in the resist layer is described above. The first metal layer 30 may be isotropically deposited after the opening 16 is formed on the pad 12. That is, the first metal layer 30 may be grown not only in the height direction but also the width direction.

A method for making a semiconductor device in accordance with the present invention will now be described. FIG. 21 and FIG. 22 show the method for making the semiconductor device.

As shown in FIG. 21, bumps 120 of a semiconductor chip 10 are electrically connected to leads 130. The embodiment shows an application of a TAB technology. The leads 130 are formed on a substrate 140 (tape). The substrate 140 has a device hole 142 and a plurality of leads 130 protrude towards the inner side of the device hole 142. The semiconductor chip 10 is placed at the device hole 142 of the substrate 140, and each bump 120 is bonded to a part (inner lead 132) of the corresponding lead 130. The end of the lead 130 may be bent towards the bump 120. The material for the lead 130 is not limited and may be, for example, copper.

At least the inner lead 132 of the lead 130 is plated. The thickness of the plated layer 134 is not limited. The plated layer 134 may be a tin layer (Sn layer).

The second metal layer 110 of the bump 120 has a large thickness in the range of, for example, approximately 0.3 to 0.7 µm. Thus, the bump 120 and the inner lead 132 are eutectically bonded to each other. In detail, the second metal layer 110 (Au layer) and the plated layer (Sn layer) of the inner lead 132 are electrically connected by the formation of eutectic crystals. Since a thick second metal layer 110 (Au layer) is formed in the step of forming the bump, the second metal layer 110 (Au layer) can be directly bonded to other conductive components (without using a solder). The eutectic bonding is performed by, for example, heating the bump 120 and the inner lead 132 to approximately 400° C. In such a case, it is preferable that the semiconductor chip 10 be preliminarily annealed at, for example, approximately 200° C. to 400° C. to avoid excess thermal stress by instantaneously heating the chip to high temperature. The annealing may be performed in air, nitrogen, or a vacuum atmosphere.

The second metal layer 110 (Au layer) is thick for eutectic bonding to other conductive components. This configuration enables bonding to the inner lead 132 at a lower cost compared with a case of a bump including a gold first metal layer 30 and a gold second metal layer 110.

The plated layer 134 of the inner lead 132 may be an Au layer, and the second metal layer 110 of the bump 120 and the plated layer 134 may be bonded by thermal welding.

FIG. 22 shows a modification of the connection between the bump 120 and a lead 150. The lead 150 is formed on a substrate 160. The lead 150 is a wire, and a plurality of wires having a predetermined pattern are formed on the substrate 160 to form a wiring pattern. The wiring pattern has a connection (land 152) to the bump 120. The land 152 has an area which is larger than that of a line connected thereto. The wiring pattern is plated at least on the land 152. The plated layer (not shown in the drawing) of the wiring pattern may be a Sn layer.

The semiconductor chip 10 is mounted onto the substrate 160 and the bump 120 and the land 152 are bonded to each other. That is, the semiconductor chip 10 is face-down-bonded to the substrate 160. In this modification, the second metal layer 110 (Au layer) of the bump 120 and the plated layer (Sn layer) of the land 152 can form eutectic crystals. In general, a resin (not shown in the drawing) is provided between the semiconductor chip 10 and the substrate 160. The resin may be used as an under-filling material.

The plated layer of the land 152 may be an Au layer and the second metal layer 110 of the bump 120 and the plated layer 134 may be bonded to each other by thermal welding.

First Modification

A first modification of the method for forming a bump will now be described.

The first sublayer 112 (Au layer) is formed on the first metal layer 30 (Ni layer). For example, a gold plating solution is provided on the first metal layer 30 to deposit gold on the surface of the nickel by substitution.

The second sublayer 114 is formed on the first sublayer 112. In this modification, the second sublayer 114 is a Sn layer. In detail, the second sublayer 114 (Sn layer) is formed by auto catalytic plating in a tin plating solution containing a predetermined reducing agent. The tin plating solution may contain SnC12. TiCl3 may be used as a reducing agent. The plating solution contains a complexing agent, a buffering agent, and a stabilizer. For example, the plating solution may contain citric acid, disodium ethylenediaminetetraacetate (EDTA), and nitrilotriacetic acid. The second sublayer 114 (Sn layer) may be formed in a plating solution at pH of 8.5 and at 80° C.

According to this modification, the second sublayer 114 (Sn layer) enables eutectic connection between the bump 120 and the lead 130 (150). In this method for making a semiconductor device, the plated layer of the lead 130 (150) is preferably an Au layer. According to this, a Sn—Au eutectic alloy can be formed.

Alternatively, the first sublayer 112 may be a palladium layer (Pd layer) and the second sublayer 114 may be a tin layer (Sn layer). In this case, the Pd layer (first sublayer 112) is formed on the first metal layer 30 by auto catalytic plating and the Sn layer (second sublayer 114) is formed thereon.

The second metal layer 110 is not limited to the above-described metal, and may be a copper layer (Cu layer) or a layer containing copper and palladium (Cu+Pd layer). In detail, palladium crystal nuclei are selectively provided on the Ni layer (first metal layer 30), and a Cu layer with a thickness of approximately 1 to 3 $\mu$m is formed by auto-catalytic plating thereon. Finally, a Sn layer is formed on the surface of the Cu layer by immersion plating to form a bump.

Alternatively, an alloy layer including Sn and at least one element selected from Au, Cu, Bi, and Zn or including Sn may be formed on the first metal layer 30 by an evaporation process. This alloy may have a thickness of approximately 0.2 $\mu$m to 0.3 $\mu$m. Alternatively, the Sn layer or the like may be formed by an evaporation process after the Au layer as the first layer is formed on the first metal layer 30 by immersion plating.

Second Modification

A second modification of the method for forming a bump will now be described. In this modification, the configuration of the second sublayer 114 in the second metal layer 110 is modified.

In this modification, a tin plating solution used for forming the second sublayer 114 contains at least one of Cu and Ag. Fine particulate Cu and/or Au may be contained in the tin plating solution. The particle diameter may be approximately 10 to 100 $\mu$m. For example, Ag particles having a diameter of approximately 70 nm are contained in the plating solution in an amount of approximately 5 g/l. Alternatively, Cu particles having a diameter of approximately 100 nm may be contained in the plating solution in an amount of approximately 3 g/l. The plating solution containing these particles is heated and agitated.

The second sublayer 114 is formed using this tin plating solution. That is, Sn is deposited and at least one of Cu and Ag is simultaneously deposited. The second sublayer 114 is a Sn layer. In more detail, the second sublayer 114 is any one of a Sn—Cu layer, a Sn—Ag layer, or a Sn—Ag—Cu layer, depending on the particles contained in the plating solution. The thickness of the second sublayer 114 is not limited and may be approximately 5 $\mu$m.

According to this modification, the bump 120 and the lead 130 (150) can be successfully bonded, even if the plated layer 134 of the lead 130 (150) is formed of a material other than gold. Accordingly, the bump 120 and the lead 130 (150) can be bonded as in the case of the formation of the bump 120 with solder.

The material for the plated layer of the lead 130 (150) connected to the bump 120 is not limited and may be gold, tin, or copper. The bump 120 and the lead 130 (150) may be bonded by heating both to approximately 250° C.

FIG. 23 shows a circuit board 1000 which mounts the semiconductor device 1 in accordance with the present invention. The circuit board 1000 may be an organic board, such as a glass-epoxy board or a polyimide film, or a glass board, such as liquid crystal display board. The circuit board 1000 includes a circuit of a wiring pattern formed of, for example, copper. The wiring pattern and external terminals 80 are mechanically connected to ensure electrical connection therebetween.

As examples of electronic devices including the semiconductor device 1 of the present invention, FIG. 24 shows a notebook personal computer 1100 and FIG. 25 shows a portable phone 1200.

What is claimed is:

1. A method for forming a bump, comprising:
   forming a resist layer that defines a through hole which overlaps at least a portion of a pad covered with an insulating film;
   forming an opening in the insulating film after forming the resist layer, the opening exposing at least a part of the pad; and
   forming a metal layer constituting a bump in the opening after forming the opening, the metal layer connected to the portion of the pad exposed in the opening,
   the insulating film being thicker at the periphery of the pad than at the center of the pad.

2. The method for forming a bump according to claim 1, the through hole being formed inside the periphery of the pad and at a portion of the pad where the insulating film is thinner.

3. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and the opening being formed so as to be larger than a periphery of the through hole so as to define a region upon which to form the first metal layer and to leave an exposed portion of the pad, the second metal layer being formed so as to cover the exposed portion of the pad.

4. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and the first metal layer being formed in the through hole, the resist layer being removed, and then the second metal layer being formed so as to cover the first metal layer.

5. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and the first metal layer being formed so as to protrude from the through hole so that the first metal layer has a tip having a width which is larger than a width of the through hole.

6. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and the second metal layer being formed so as to protrude from the through hole so that the second metal layer has a tip having a width which is larger than a width of the through hole.

7. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and the first metal layer being formed by electroless plating.

8. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and the second metal layer being formed by electroless plating.

9. A method for forming a bump, comprising:

forming a resist layer that defines a through hole which overlays at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, and further comprising the step of providing a solder on the metal layer.

10. The method for forming a bump according to claim 9, the step of providing the solder includes providing a resin layer at the periphery of the metal layer other than on at least an upper face of the metal layer so that the solder is provided at a portion of the metal layer that is exposed from the resin layer.

11. The method for forming a bump according to claim 9, the upper surface of the metal layer being formed so as to be substantially flush with the upper surface of the resist layer, and the solder being provided at a portion of the metal layer exposed from the resist layer.

12. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, the first metal layer being formed in the through hole, and then the second metal layer being formed on the first metal layer without removing the resist layer, and the upper surface of the first metal layer being formed so as to be lower than the upper surface of the resist layer, and the second metal layer being provided by a printing process using the resist layer as a mask.

13. A method for forming a bump, comprising:

forming a resist layer that defines a through hole which overlaps at least a portion of a pad covered with an insulating film;

forming an opening in the insulating film after forming the resist layer, the opening exposing at least a part of the pad; and forming a metal layer constituting a bump in the opening after forming the opening, the metal layer connected to the portion of the pad exposed in the opening, the metal layer including a first metal layer and a second metal layer formed on the first metal layer, the second metal layer being formed on the first metal layer, the first metal layer being formed in the through hole, and then the second metal layer being formed on the first metal layer without removing the resist layer, and further including the step of forming a conductive film on the insulating material so as to be electrically connected to the first metal layer at the periphery of the through hole, the upper surface of the first metal layer being formed so as to be lower than the upper surface of the resist layer, and the second metal layer being provided by electroplating using the conductive film as an electrode.

14. The method for forming a bump according to claim 7, the first metal layer including a nickel-containing material.

15. The method for forming a bump according to claim 7, the second metal layer including a gold-containing material.

16. The method for forming a bump according to claim 7, the second metal layer including a solder.

17. The method for forming a bump according to claim 9, the solder including Sn, or Sn and at least one metal selected from the group consisting of Ag, Cu, Bi, and Zn.

18. The method for forming a bump according to claim 8, the second metal layer including first and second Au layers, the first Au layer being formed on the first metal layer by immersion plating, and the second Au layer being formed on the first Au layer by autocatalytic plating.

19. The method for forming a bump according to claim 8, the second metal layer including an Au layer and a Sn layer, the Au layer being formed on the first metal layer by immersion plating, and the Sn layer being formed on the Au layer by autocatalytic plating.

20. The method for forming a bump according to claim 19, the step of forming the Sn layer includes forming the Sn layer with an electroless tin plating solution that contains at least one of Cu and Ag so as to deposit Sn and at least one of Cu and Ag.

21. A method for manufacturing a semiconductor device, comprising the method for forming a bump according to claim 7, the metal layer being formed on the pad formed in a semiconductor chip.

22. The method for making a semiconductor device according to claim 21, further including the step of electrically connecting the bump to a lead, the metal layer in the bump and the lead thereby forming an eutectic crystal.

23. A semiconductor device manufactured by a method for making a semiconductor device according to claim 21.

24. A circuit board comprising the semiconductor device according to claim 23.

25. An electronic device comprising the semiconductor device according to claim 23.

26. The method for forming a bump according to claim 7, the through hole being formed so as not to extend beyond the periphery of the pad.

27. The method of forming a bump according to claim 7, the first metal layer being formed in the through hole, and then the second metal layer being formed on the first metal layer without removing the resist layer.

* * * * *